(12) United States Patent
Kaminaga

(10) Patent No.: US 10,269,820 B1
(45) Date of Patent: Apr. 23, 2019

(54) THREE-DIMENSIONAL MEMORY DEVICE CONTAINING DIFFERENT PEDESTAL WIDTH SUPPORT PILLAR STRUCTURES AND METHOD OF MAKING THE SAME

(71) Applicant: SANDISK TECHNOLOGIES LLC, Plano, TX (US)

(72) Inventor: Michimoto Kaminaga, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/943,859

(22) Filed: Apr. 3, 2018

(51) Int. Cl.
| H01L 27/11556 | (2017.01) |
| H01L 27/11582 | (2017.01) |
| H01L 27/11565 | (2017.01) |
| H01L 27/1157 | (2017.01) |
| H01L 27/11519 | (2017.01) |
| H01L 27/11524 | (2017.01) |

(52) U.S. Cl.
CPC .... H01L 27/11556 (2013.01); H01L 27/1157 (2013.01); H01L 27/11519 (2013.01); H01L 27/11524 (2013.01); H01L 27/11565 (2013.01); H01L 27/11582 (2013.01)

(58) Field of Classification Search
CPC ......... H01L 27/11556; H01L 27/11524; H01L 27/11519; H01L 27/11565; H01L 27/11582; H01L 27/1157
See application file for complete search history.

(56) References Cited

U.S. PATENT DOCUMENTS

| 5,915,167 | A | 6/1999 | Leedy | |
| 8,245,962 | B2 * | 8/2012 | Didion | B02C 17/002 241/74 |
| 8,680,604 | B2 | 3/2014 | Higashi et al. | |
| 9,023,719 | B2 | 5/2015 | Pachamuthu et al. | |
| 9,035,372 | B2 | 5/2015 | Song | |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — John P. Dulka
(74) *Attorney, Agent, or Firm* — The Marbury Law Group PLLC

(57) ABSTRACT

A three-dimensional memory device includes an alternating stack having stepped surfaces and including insulating layers and electrically conductive layers, memory stack structures extending through each layer of the alternating stack in a memory array region, and support pillar structures extending through the stepped surfaces of the alternating stack. The support pillar structures include first-type support pillar structures vertically extending through at least two electrically conductive layers and including a respective first dummy pedestal channel portion having a respective first maximum lateral dimension along a first horizontal direction, and second-type support pillar structures vertically extending through no more than a single electrically conductive layer, and including a respective second dummy pedestal channel portion having a respective second maximum lateral dimension along the first horizontal direction that is greater than the first maximum lateral dimension.

20 Claims, 35 Drawing Sheets

(56) References Cited

U.S. PATENT DOCUMENTS

| | | | |
|---|---|---|---|
| 9,230,973 B2 | 1/2016 | Pachamuthu et al. | |
| 9,230,979 B1 | 1/2016 | Pachamuthu et al. | |
| 9,230,980 B2 | 1/2016 | Rabkin et al. | |
| 9,230,987 B2 | 1/2016 | Pachamuthu et al. | |
| 9,246,088 B2 | 1/2016 | Yamamoto et al. | |
| 9,356,043 B1 | 5/2016 | Sakakibara et al. | |
| 9,455,263 B2 | 9/2016 | Zhang et al. | |
| 9,478,558 B2 | 10/2016 | Koka et al. | |
| 9,484,357 B2 | 11/2016 | Makala et al. | |
| 9,524,976 B2 | 12/2016 | Pachamuthu et al. | |
| 9,530,790 B1 * | 12/2016 | Lu | H01L 27/11582 |
| 9,576,967 B1 | 2/2017 | Kimura et al. | |
| 9,659,956 B1 | 5/2017 | Pachamuthu et al. | |
| 9,685,452 B2 * | 6/2017 | Lee | H01L 27/11582 |
| 9,716,105 B1 | 7/2017 | Tsutsumi | |
| 9,768,192 B1 | 9/2017 | Nakamura | |
| 9,780,034 B1 | 10/2017 | Tsutsumi et al. | |
| 9,786,681 B1 | 10/2017 | Ariyoshi | |
| 10,115,730 B1 * | 10/2018 | Baraskar | H01L 27/11582 |
| 2006/0102586 A1 | 5/2006 | Lee et al. | |
| 2007/0252201 A1 | 11/2007 | Kito et al. | |
| 2012/0199897 A1 | 8/2012 | Chang et al. | |
| 2013/0065386 A1 * | 3/2013 | Kim | H01L 29/7926 438/591 |
| 2013/0161821 A1 | 6/2013 | Hwang et al. | |
| 2014/0054676 A1 | 2/2014 | Nam et al. | |
| 2014/0198553 A1 | 7/2014 | Lung | |
| 2014/0284691 A1 | 9/2014 | Takamura et al. | |
| 2015/0104916 A1 | 4/2015 | Lee et al. | |
| 2015/0115348 A1 | 4/2015 | Nam et al. | |
| 2015/0179660 A1 | 6/2015 | Yada et al. | |
| 2015/0294978 A1 | 10/2015 | Lu et al. | |
| 2015/0348984 A1 | 12/2015 | Yada et al. | |
| 2016/0056169 A1 | 2/2016 | Lee et al. | |
| 2016/0099289 A1 | 4/2016 | Yamato et al. | |
| 2016/0111432 A1 | 4/2016 | Rabkin et al. | |
| 2016/0141294 A1 | 5/2016 | Peri et al. | |
| 2016/0172366 A1 * | 6/2016 | Koka | H01L 29/7883 257/314 |
| 2016/0268209 A1 | 9/2016 | Pachamuthu et al. | |
| 2016/0329101 A1 | 11/2016 | Sakakibara | |
| 2016/0329343 A1 | 11/2016 | Pachamuthu et al. | |
| 2016/0379989 A1 | 12/2016 | Sharangpani et al. | |
| 2017/0125437 A1 | 5/2017 | Pachamuthu et al. | |
| 2017/0125438 A1 | 5/2017 | Pachamuthu et al. | |
| 2017/0271261 A1 | 9/2017 | Tsutsumi et al. | |
| 2017/0271352 A1 | 9/2017 | Nakamura | |
| 2017/0278860 A1 * | 9/2017 | Aoyama | H01L 27/11582 |
| 2017/0287926 A1 | 10/2017 | Ariyoshi | |
| 2018/0108671 A1 * | 4/2018 | Yu | H01L 27/11575 |
| 2018/0130812 A1 * | 5/2018 | Hosoda | H01L 27/11556 |
| 2018/0197876 A1 * | 7/2018 | Ge | H01L 27/11582 |

OTHER PUBLICATIONS

Wong et al., "Wafer Temperature Dependence of the Vapor-Phase HF Oxide Etch," J. Electrochem., Soc., vol. 140, No. 1, pp. 205-208 (1993).

H. Seidel, J. Electrochem. Soc., vol. 137, No. 11 (1990), "Anisotropic Etching of Crystalline Silicon in Alkaline Solutions".

Matsumura, et al., "Formation of Silicon Nitride Film by HCD Ion Plating Process and its Properties", J. Japan Inst. Metals, Vo. 47, No. 11 (1983) pp. 991-997.

U.S. Appl. No. 15/296,380, filed Oct. 18, 2016, Sandisk Technologies LLC.

U.S. Appl. No. 15/347,101, filed Nov. 9, 2016, Sandisk Technologies LLC.

U.S. Appl. No. 15/401,426, filed Jan. 9, 2017, Sandisk Technologies LLC.

U.S. Appl. No. 15/626,766, filed Jun. 19, 2017, Sandisk Tehcnologies LLC.

U.S. Appl. No. 15/715,629, filed Sep. 26, 2017, Sandisk Technologies LLC.

U.S. Appl. No. 15/840,090, filed Dec. 13, 2017, Sandisk Technologies LLC.

\* cited by examiner

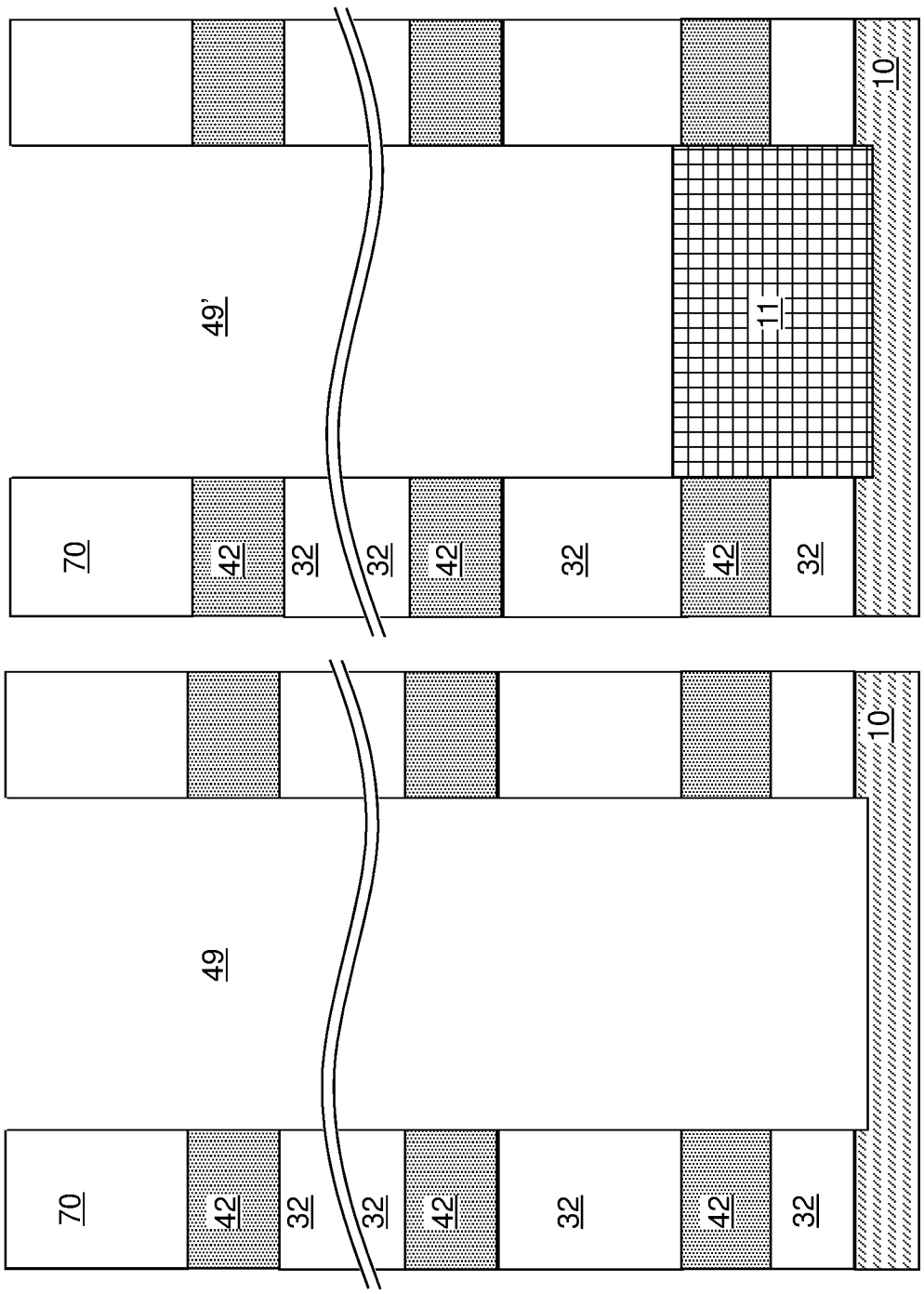

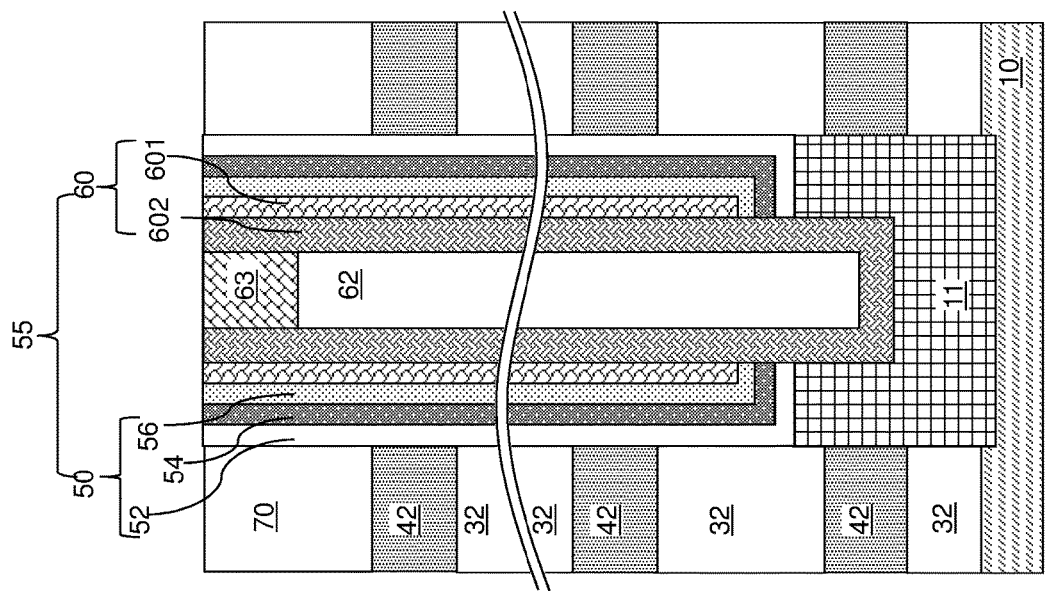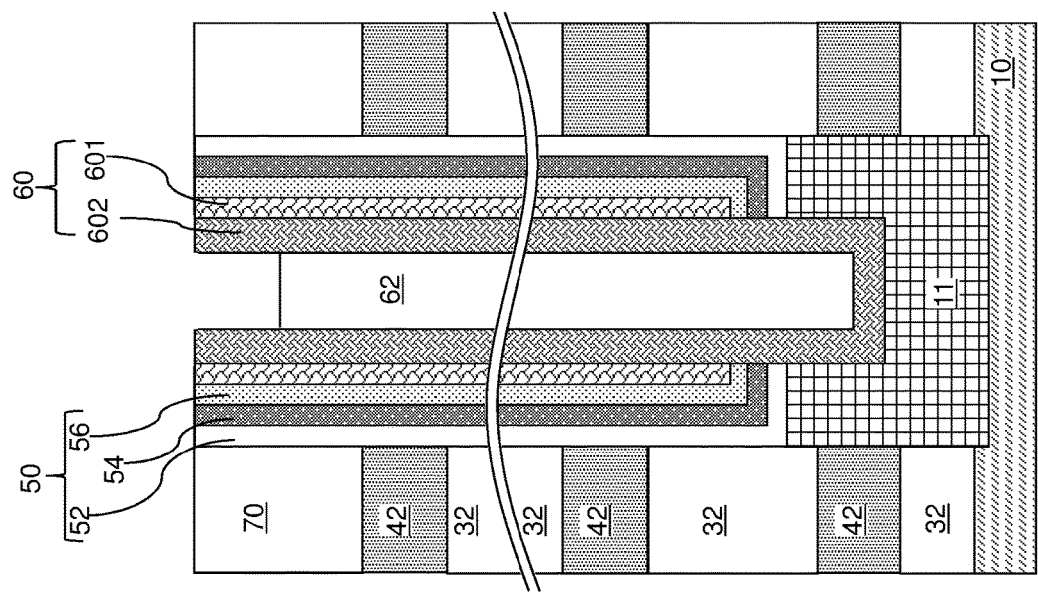

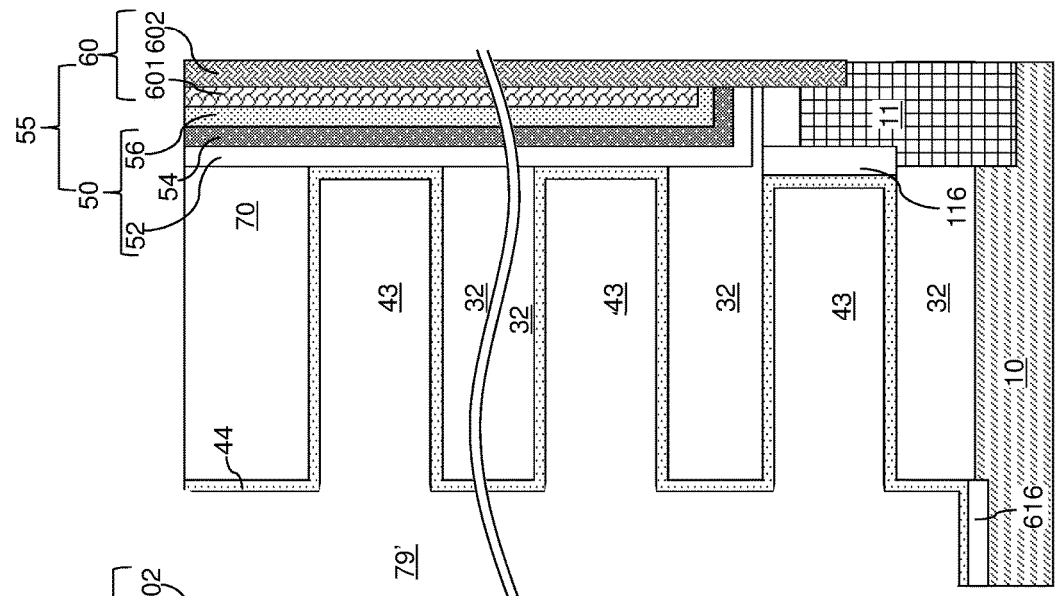
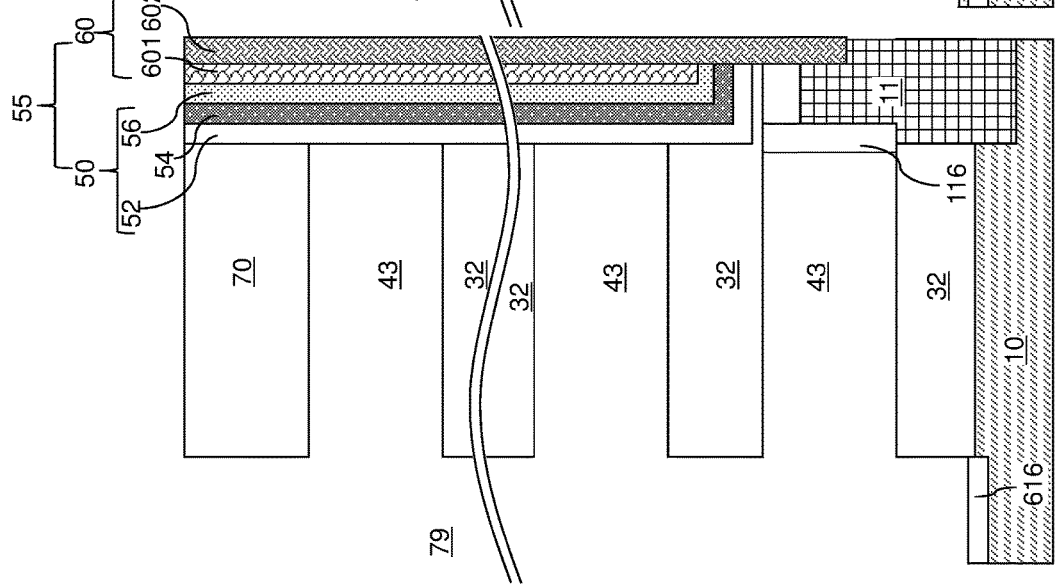

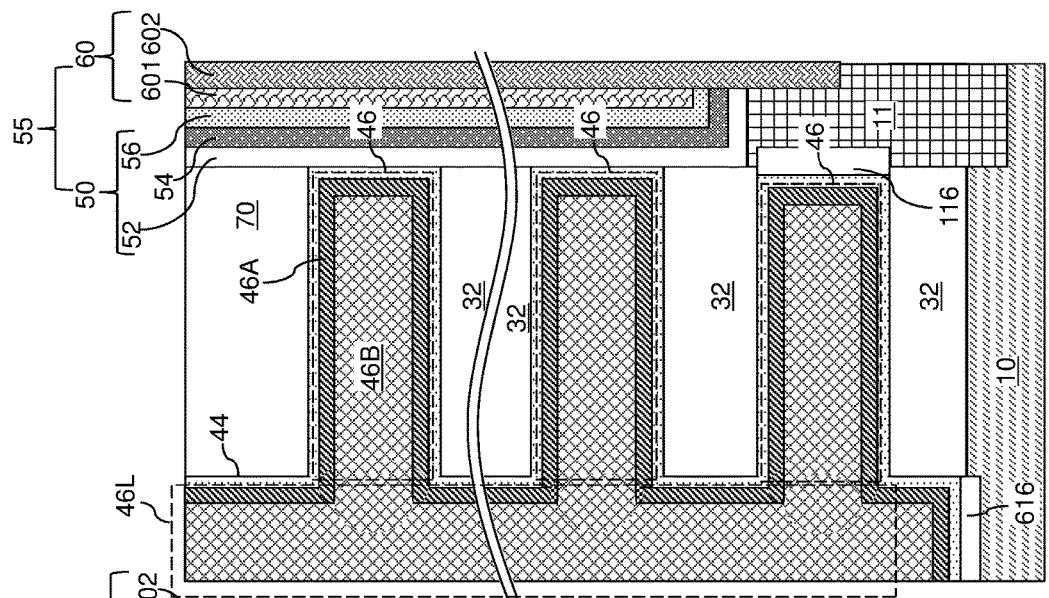
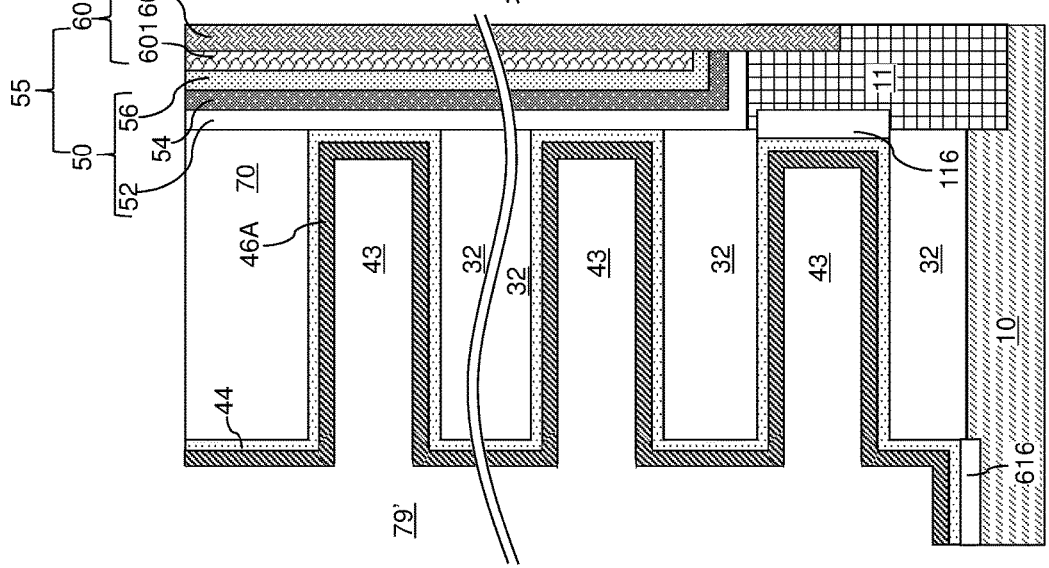

THREE-DIMENSIONAL MEMORY DEVICE CONTAINING DIFFERENT PEDESTAL WIDTH SUPPORT PILLAR STRUCTURES AND METHOD OF MAKING THE SAME

FIELD

The present disclosure relates generally to the field of semiconductor devices, and particular to a three-dimensional memory device containing support pillar structures having different pedestal widths and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate, wherein the alternating stack includes stepped surfaces that continuously extend from a bottommost layer of the alternating stack to a topmost layer of the alternating stack with stepwise changes in height along a first horizontal direction; memory stack structures extending through each layer of the alternating stack in a memory array region, wherein each of the memory stack structures comprises a respective memory film and a respective vertical semiconductor channel contacting an inner sidewall of the respective memory film, and wherein the memory stack structure overlies a respective pedestal channel portion contacting a bottom surface of the memory film; and support pillar structures extending through the stepped surfaces of the alternating stack, wherein the support pillar structures comprise: first-type support pillar structures vertically extending through at least two electrically conductive layers within the alternating stack and comprising a respective first dummy memory film, and a respective first dummy vertical semiconductor channel, and a respective first dummy pedestal channel portion having a respective first maximum lateral dimension along the first horizontal direction; and second-type support pillar structures vertically extending through no more than a single electrically conductive layer within the alternating stack and comprising a respective second dummy memory film, and a respective second dummy vertical semiconductor channel, and a respective second dummy pedestal channel portion having a respective second maximum lateral dimension along the first horizontal direction that is greater than the first maximum lateral dimension.

According to another aspect of the present disclosure, a method of forming a three-dimensional memory device is provided, which comprises: forming an alternating stack of insulating layers and sacrificial material layers over a substrate having a semiconductor surface; forming stepped surfaces that continuously extend from a bottommost layer of the alternating stack to a topmost layer of the alternating stack with stepwise changes in height along a first horizontal direction by patterning the alternating stack; forming memory openings, first-type support openings, and second-type support openings through the alternating stack, wherein one or more of the second-type support openings cut through a bottommost vertical step of the stepped surfaces, each of the first-type support openings extends through a plurality of insulating layers within the alternating stack, and each of the memory openings vertically extends through each layer within the alternating stack; forming memory stack structures, first-type support pillar structure, and second-type support pillar structures through the alternating stack in the memory opening, the first-type support openings, and the second-type support openings, respectively, wherein the second-type support openings have a respective maximum lateral dimension along the first horizontal direction that is greater than maximum lateral dimensions of the first-type support openings along the first horizontal direction; and replacing the spacer material layers with electrically conductive layers.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 10A-10D are sequential vertical cross-sectional views of a region of the exemplary structure during formation of electrically conductive layers according to an embodiment of the present disclosure.

DETAILED DESCRIPTION

Figure 1:
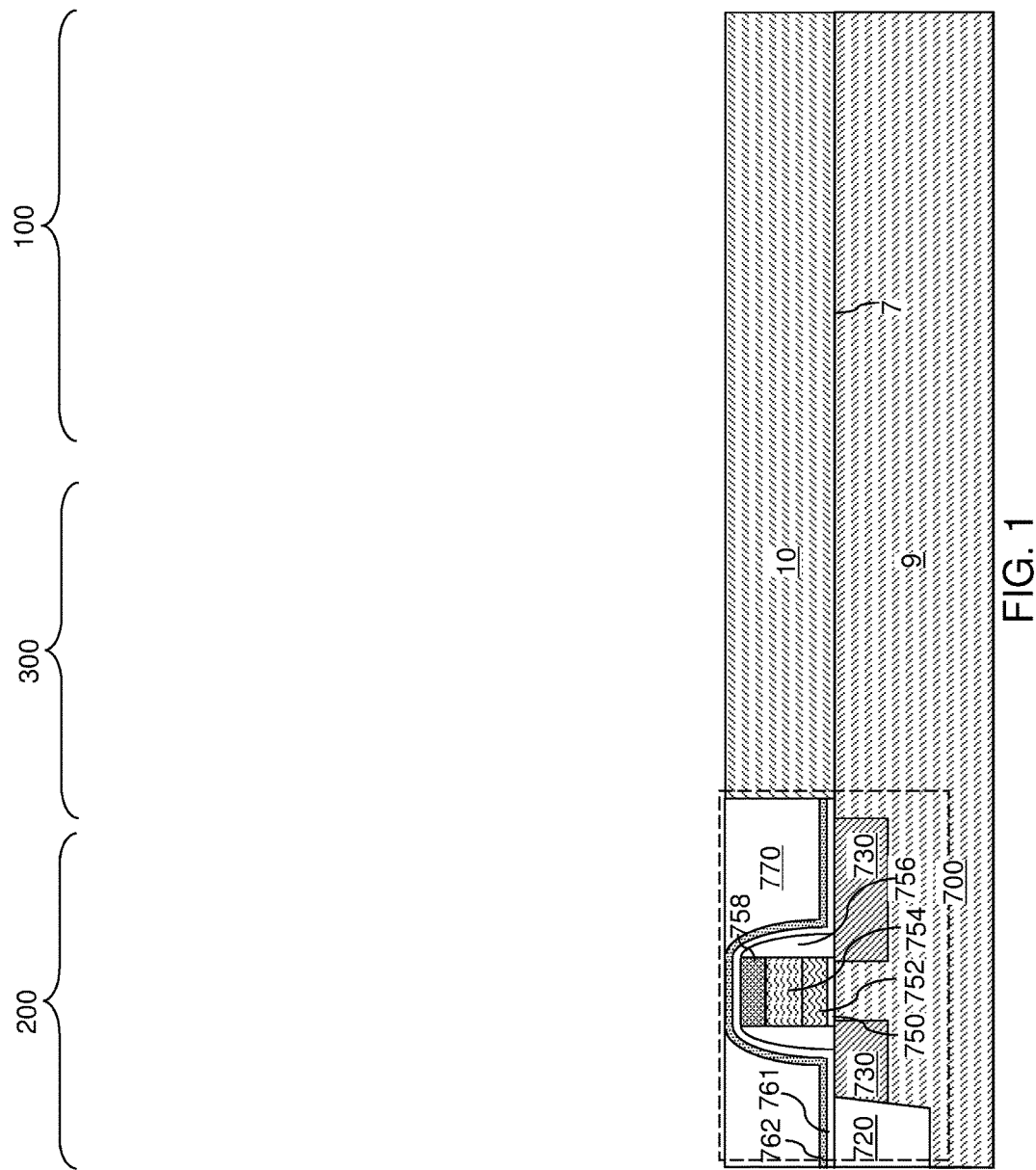
FIG. 1 is a schematic vertical cross-sectional view of an exemplary structure after formation of at least one peripheral device, a semiconductor material layer, and a gate dielectric layer according to an embodiment of the present disclosure.

As discussed above, the embodiments of the present disclosure are directed to a three-dimensional memory device including support pillar structures containing support pillar structures having different pedestal widths which reduce or prevent electrical shorts to a source select gate electrode and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
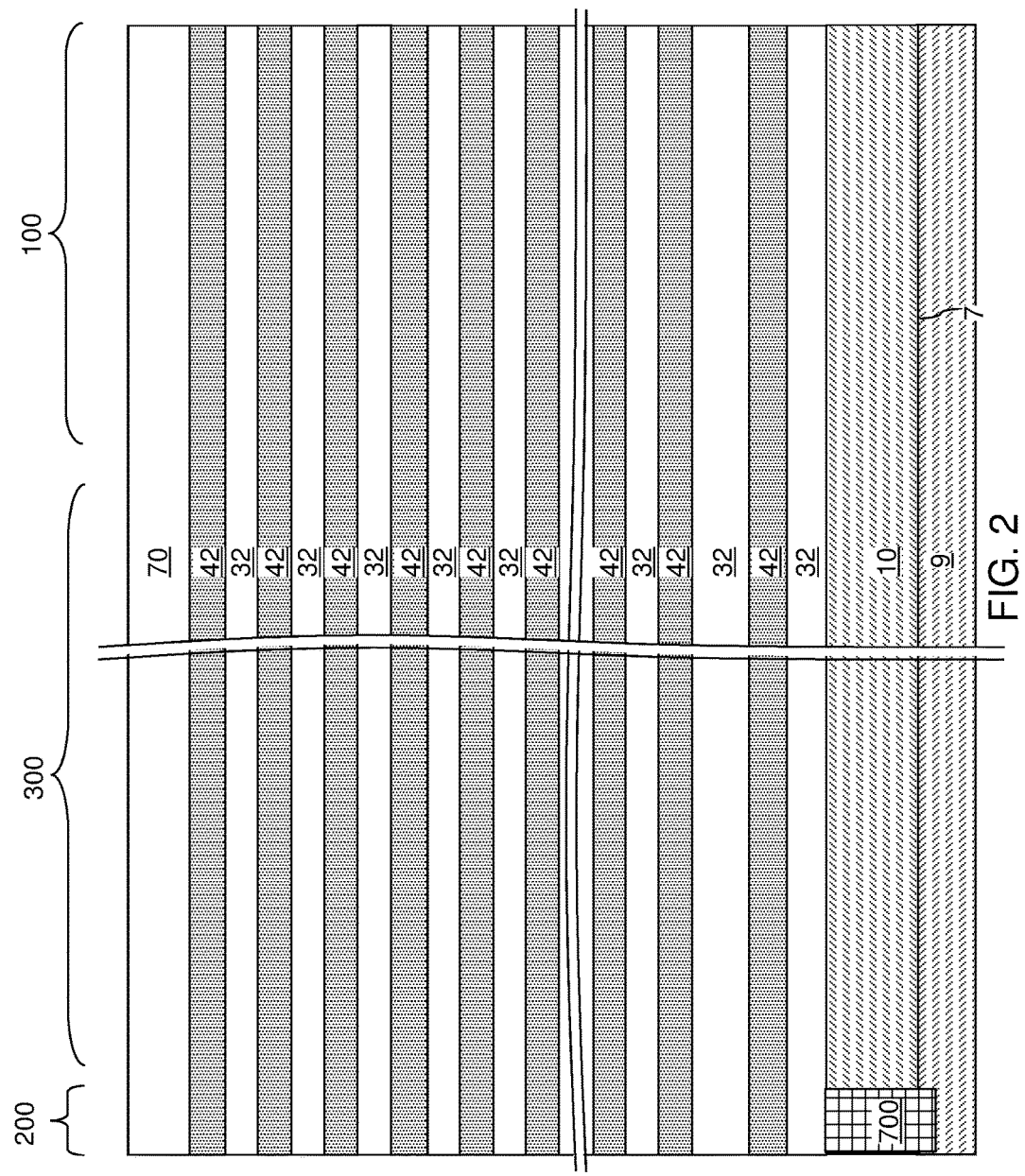
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate semiconductor layer 9.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
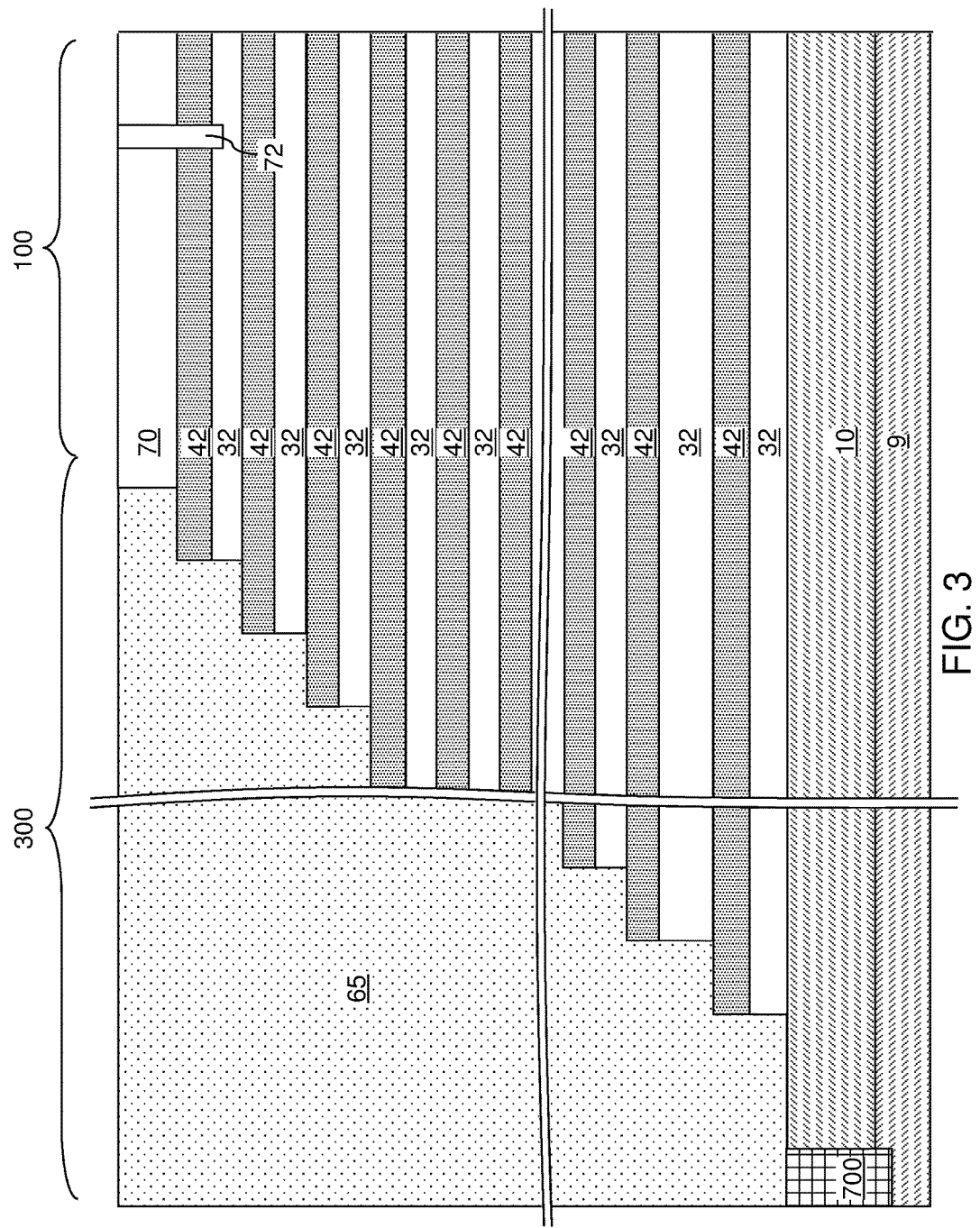
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction (e.g., word line direction) hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction (e.g., bit line direction) hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
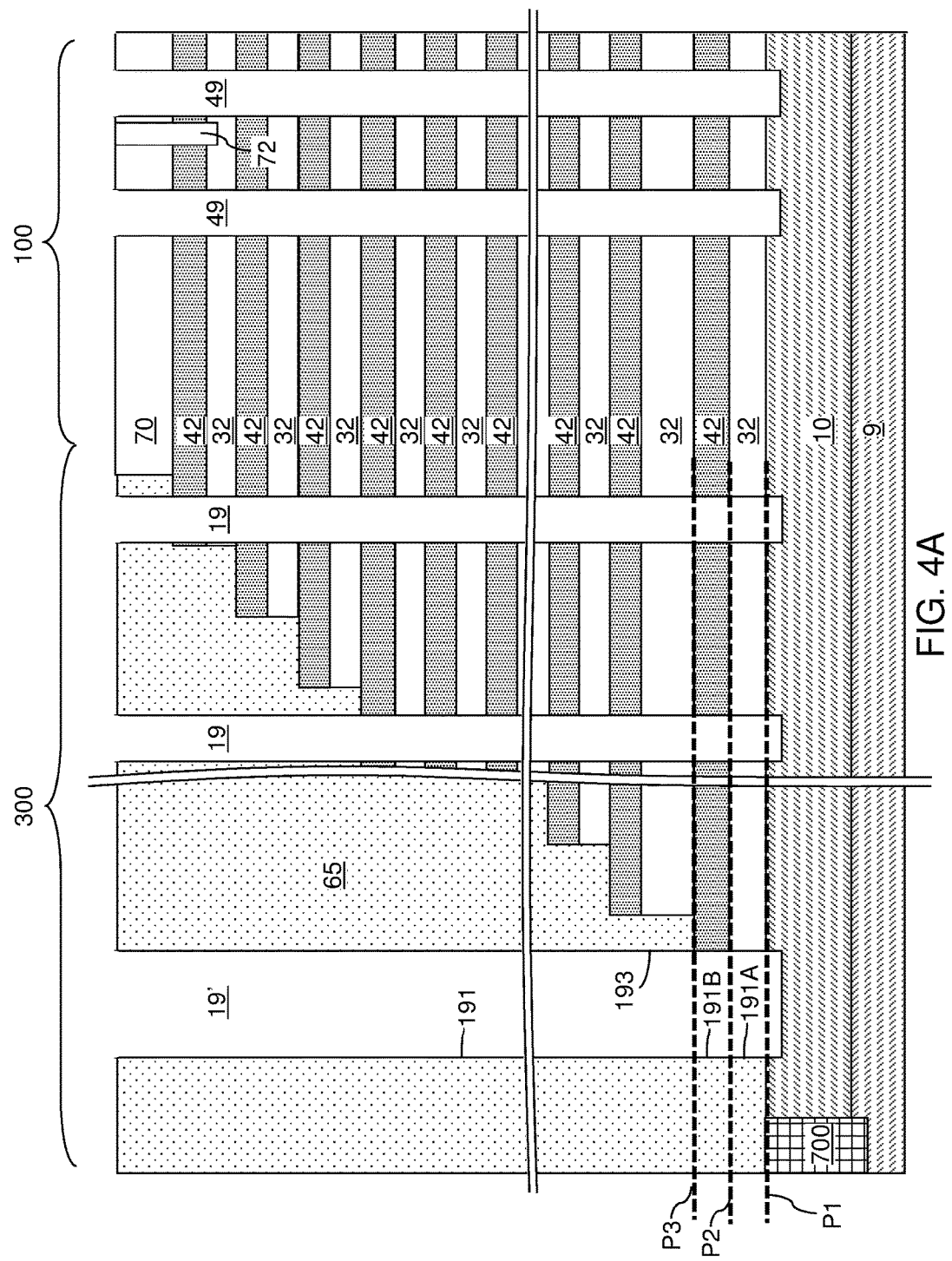
FIG. 4A is a schematic vertical cross-sectional view of the exemplary structure after formation of memory openings and support openings according to an embodiment of the present disclosure.
Figure 4B:
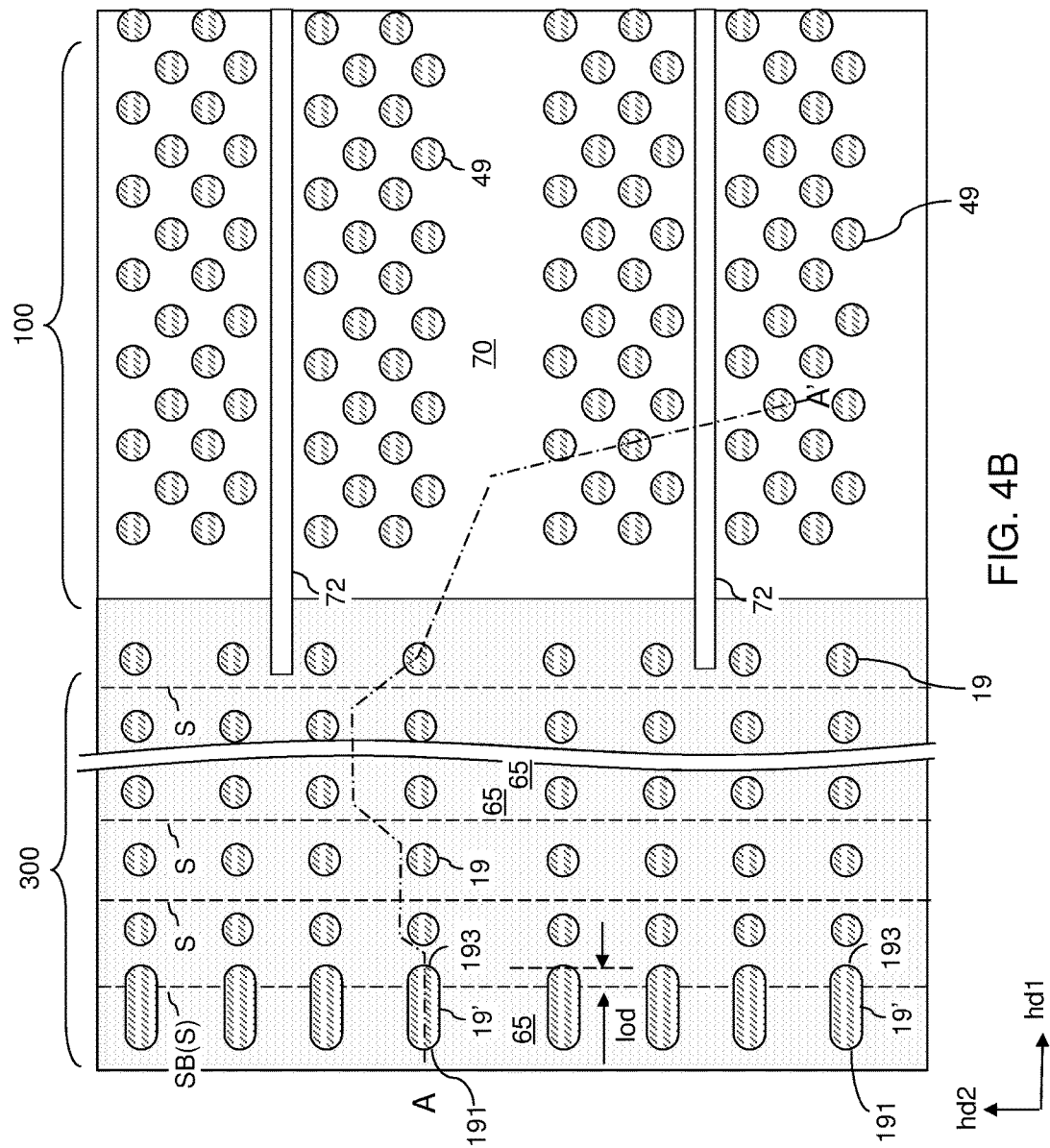
FIG. 4B is a top-down view of the exemplary structure of FIG. 4A. The vertical plane A-A' is the plane of the vertical cross-sectional view of FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings (19, 19'). As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and through each layer within the alternating stack (32, 42) in the memory array region 100. The support openings (19, 19') are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings (19, 19') extend through a subset of layers within the alternating stack (32, 42), which can be less than the entirety of all layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings (19, 19') can be substantially vertical, or can be tapered. The patterned lithographic material stack can be subsequently removed, for example, by ashing.

The memory openings 49 and the support openings (19, 19') can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening (19, 19'). The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings (19, 19') may be coplanar with the topmost surface of the semiconductor material layer 10.

Each of the memory openings 49 and the support openings (19, 19') may include a sidewall (or a plurality of sidewalls) that extends substantially perpendicular to the topmost surface of the substrate. A two-dimensional array of memory openings 49 can be formed in the memory array region 100. A two-dimensional array of support openings (19, 19') can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings (19, 19') can be extend to a top surface of the substrate semiconductor layer 9.

Locations of the vertical steps S are illustrated in FIG. 4B. According to an aspect of the present disclosure, the support openings (19, 19') include two types of openings, which are herein referred to as first-type support openings 19 and second-type support openings 19'. Each first-type support opening 19 extends through at least two steps. As a consequence, each of the first-type support openings 19 vertically extends through a plurality of insulating layers 32 within the alternating stack (32, 42). Each first-type support openings 19 is laterally spaced from a bottommost vertical step SB of the stepped surfaces of the alternating stack (32, 42) that contact the retro-stepped dielectric material portion 65. Thus, as shown in FIG. 4A, each portion of the first-type support openings 19 located between the horizontal plane P1 including a bottom surface of a bottommost insulating layer 32 and the horizontal plane P2 including a top surface of the bottommost insulating layer 32 does not directly contact the retro-stepped dielectric material portion 65. In one embodiment, each portion of the first-type support openings 19 located between the horizontal plane P1 including a bottom surface of a bottommost insulating layer 32 and the horizontal plane P3 including a top surface of the bottommost sacrificial material layer 42 does not directly contact the retro-stepped dielectric material portion 65.

Each of the second-type support openings 19' extends (e.g., cuts) through a bottommost vertical step SB of the stepped surfaces. In one embodiment, one or more of the second-type support openings 19' cut through only a single sacrificial material layer (i.e., the bottommost sacrificial material layer 42) among the alternating stack (32, 42) and therefore, the second-type support openings 19' can extend through only one step (e.g., the bottommost vertical step SB). The bottommost vertical step SB of the stepped surfaces adjoins the top surface of the substrate (9, 10), which can be a top surface of the semiconductor material layer 10 or a top surface of the substrate semiconductor layer 9. Thus, each portion of the second-type support openings 19' located between the horizontal plane P1 including a bottom surface of a bottommost insulating layer 32 and the horizontal plane P2 including a top surface of the bottommost insulating layer 32 includes a continuously extending straight sidewall surface 191 (e.g., portion 191A of surface 191 as shown in FIG. 4A) that directly contacts the retro-stepped dielectric material portion 65. In one embodiment, each portion of the second-type support openings 19' located between the horizontal plane P1 including a bottom surface of a bottommost insulating layer 32 and the horizontal plane P3 including a top surface of the bottommost sacrificial material layer 42 includes a continuously extending straight sidewall surface 191 (e.g., portion 191B of surface 191 as shown in FIG. 4A) that directly contacts the retro-stepped dielectric material portion 65.

According to another aspect of the present disclosure, the shapes and locations of the first-type support openings 19 and the second-type support openings 19' can be selected such that each of the second-type support openings 19' cuts through a bottommost vertical step SB of the stepped surfaces of the alternating stack (32, 42), while each of the first-type support openings 19 does not cut through any bottommost vertical step of the stepped surfaces of the alternating stack (32, 42). In one embodiment, the first-type support openings 19 can be circular or elliptical with a ratio between the major axis to the minor axis not greater than 1.2, and the second-type support openings 19' can be elongated along a first horizontal direction hd1, which is the horizontal direction that is perpendicular to the planes of the vertical steps S of the stepped surfaces. The minimum lateral dimension of each second-type support opening 19' can be along a second horizontal direction hd2, which is perpendicular to the first horizontal direction hd2.

In one embodiment, the ratio of the maximum lateral dimension to the minimum lateral dimension with a horizontal cross-sectional shape of each second-type support opening 19' can be at least 1.5, and can be in a range from 1.5 to 6.0, such as from 2.0 to 4.0. In one embodiment, the maximum lateral dimension of each second-type support openings 19' can be along the first horizontal direction hd1, and the minimum lateral dimension of each second-type support openings 19' can be along the second horizontal direction hd2. In one embodiment, the second-type support openings 19' can wider in the first horizontal direction hd1 than the first-type support openings 19. In one embodiment, the second-type support openings 19' can be elongated along the first horizontal direction hd1 relative to the first-type support openings 19. In this case, the second-type support openings 19' have a respective maximum lateral dimension along the first horizontal direction hd1 that is greater than maximum lateral dimensions of the first-type support openings 19 along the first horizontal direction hd1.

According to an aspect of the present disclosure, a sidewall of each second-type support opening 19' that is most proximal to the memory array region 100 (i.e., the region including the memory openings 49) can be laterally offset from a vertical interface of the bottommost vertical step SB that the second-type support opening 19' intersects toward the memory array region 100 by a finite distance, which is herein referred to as a lateral offset distance "lod" shown in FIG. 4B. The lateral offset distance "lod" can be greater than the maximum photolithography overlay variation along the first horizontal direction hd1. For example, the nominal value for the lateral offset distance "lod" can be in a range from 120% to 600% of the maximum overlay variation along the first horizontal direction hd1. In an illustrative example, the maximum overlay variation for patterning the memory openings 49 and the support openings (19, 19') along the first horizontal direction hd1 can be in a range from 10 nm to 50 nm, and the nominal value for the lateral offset distance "lod" (as provided in a design layout for shapes of the second-type support openings 19') can be greater than 120% of the maximum overlay variation for patterning the memory openings 49 and the support openings (19, 19') along the first horizontal direction hd1.

The sidewall of a second-type support opening 19' that is most proximal to the memory array region 100 is herein referred to as a proximal sidewall 193 of the second-type support opening 19'. The proximal sidewall 193 of each second-type support opening 19' can be convex, and can be vertical or substantially vertical. The proximal sidewall of each second-type support opening 19' can include straight sidewalls of the bottommost insulating layer 32 and the bottommost sacrificial material layer 42. The sidewall 191 of a second-type support opening 19' that is most distal from the memory array region 100 is herein referred to as a distal sidewall of the second-type support opening 19'. The distal sidewall 191 of each second-type support opening 19' can continuously extend from a top surface of the substrate (9, 10) to a top surface of the retro-stepped dielectric material portion 65.

Figure 4C:
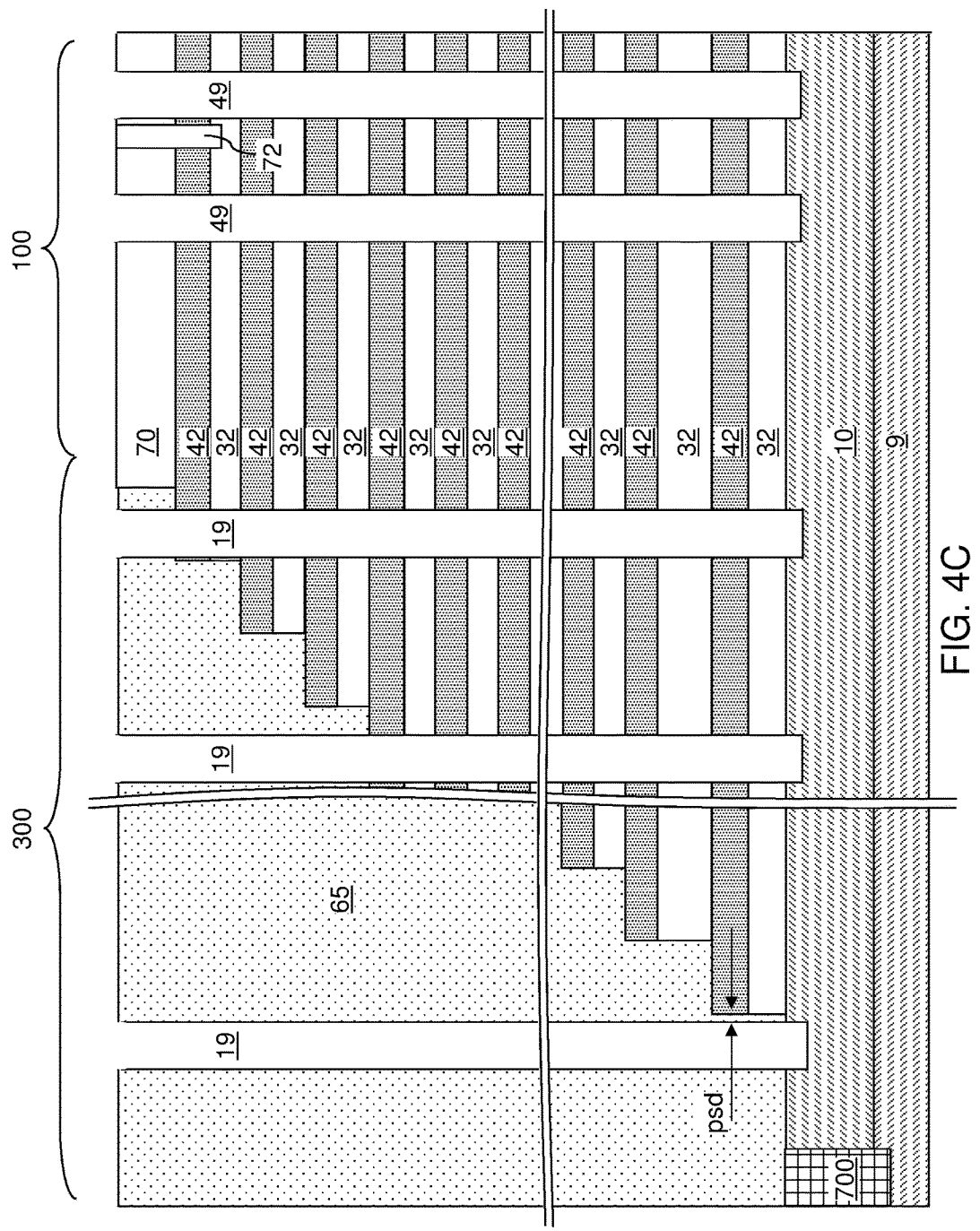
FIG. 4C is a schematic vertical cross-sectional view of a comparative exemplary structure after formation of memory openings and support openings.
Figure 4D:
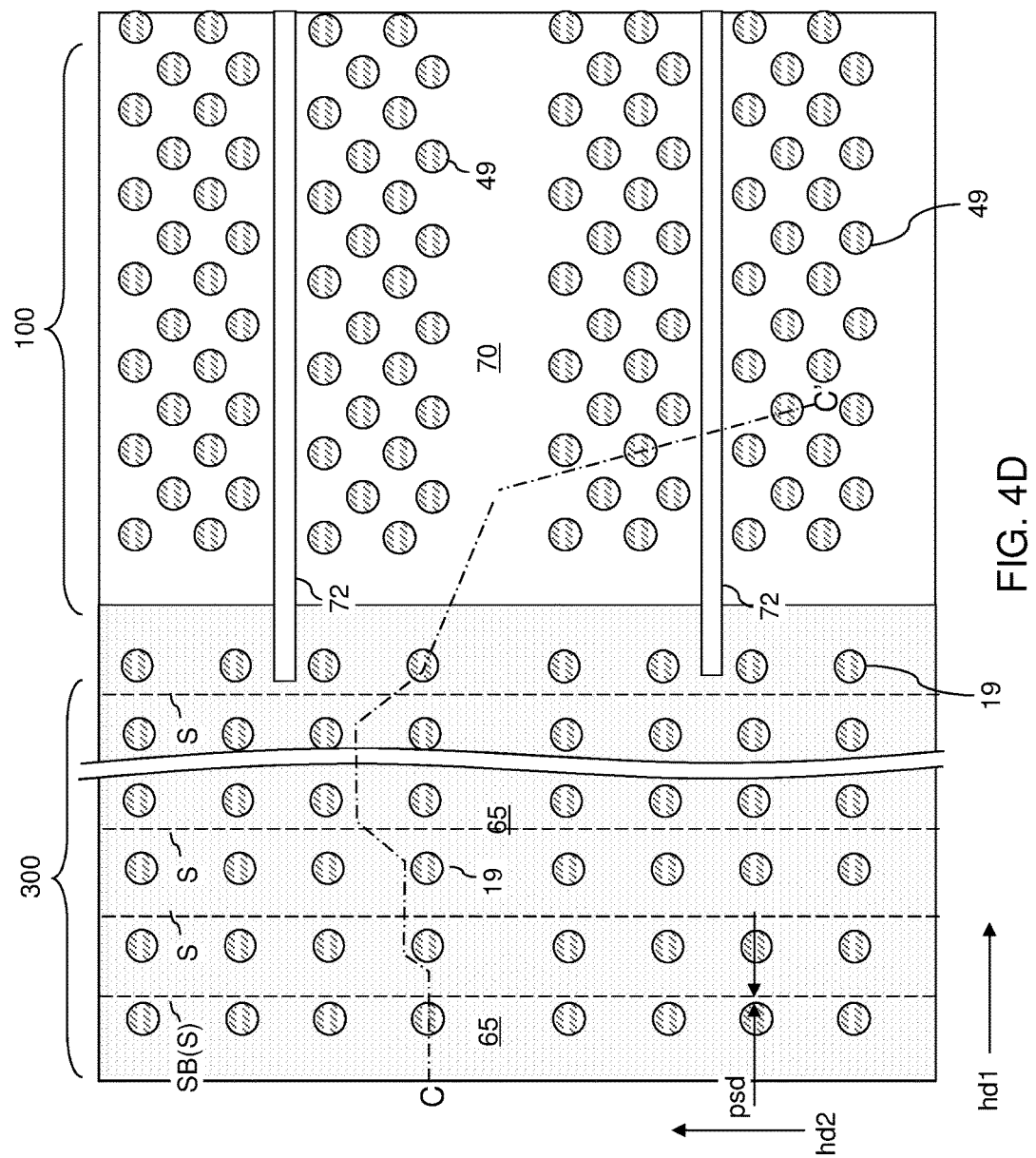
FIG. 4D is a top-down view of the exemplary structure of FIG. 4C. The vertical plane C-C' is the plane of the vertical cross-sectional view of FIG. 4C.

FIGS. 4C and 4D illustrate a comparative exemplary structure, which is herein employed to demonstrate the structural and electrical advantages of the exemplary structure of FIGS. 4A and 4B. Locations of the vertical steps S are illustrated in FIG. 4D. The comparative exemplary structure of FIGS. 4C and 4D can be derived from the exemplary structure of FIG. 3 by forming memory openings 49 and first-type support openings 19 with modifications to the design layout to provide suitable coverage of the areas of the stepped surfaces with the first-type support openings 19.

The comparative exemplary structure of FIGS. 4C and 4D does not employ any second-type support opening 19'.

In this case, the physical separation distance "psd" between a first-type support opening 19 that is most proximal to the bottommost vertical step SB of the stepped surfaces can randomly vary with overlay variations along a first horizontal direction hd1, i.e., the horizontal direction that is perpendicular to the vertical steps S of the stepped surfaces. Etch bias variability introduced during the anisotropic etch process that forms the memory openings 49 and the first-type support openings 19 amplifies the variability of the physical separation distance "psd" between first-type support openings 19 and the bottommost vertical step SB in the comparative exemplary structure. As a result, one or more of the first-type support openings 19' that are proximal to the bottommost vertical step SB of the stepped surfaces can have a physical separation distance "psd" that is in a range from 0 nm to 10 nm, such as from 0.5 nm to 2 nm. Such uncontrolled variability in the physical separation distance "psd" between the first-type support openings 19 (which is the only type of support opening in the comparative exemplary structure) and the bottommost vertical step SB can result in dielectric breakdown between semiconductor pedestal structures to be subsequently formed in the first-type support openings 19 and electrically conductive layers that replaces the sacrificial material layers 42 in a subsequent processing step.

Thus, the exemplary structure of FIGS. 4A and 4B prevents or reduces formation of thin dielectric material regions in which a dielectric breakdown can subsequently occur by forming second-type support openings 19' that cuts through the bottommost vertical step SB in the stepped surfaces.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening (19, 19'). The structural changes that occur in the first-type support openings 19 and the second-type support openings 19' can be modified in dimensions due to the differences in the dimensions and the geometry of the support openings (19, 19') relative to the dimensions and the geometry of memory openings 49.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening (19, 19') can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, a pedestal channel portion (e.g., an epitaxial pedestal) 11 can be formed at the bottom portion of each memory opening 49 and each support openings (19, 19'), for example, by a selective deposition process such as selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

The selective deposition process simultaneously deposits the doped semiconductor material on physically exposed surfaces of the semiconductor material layer 10 at bottom regions of the memory openings 49, the first-type support openings 19, and the second-type support openings 19', while suppressing growth of the doped semiconductor material from dielectric surfaces such as the surfaces of the insulating layers 32, the insulating cap layer 70, and the retro-stepped dielectric material portion 65. The selective deposition process forms the pedestal channel portions 11 in bottom regions of the memory openings 49, first dummy pedestal channel portions in bottom regions of the first-type support openings 19, and second dummy pedestal channel portions in bottom regions of the second-type support openings 19'. As used herein, a "dummy" element refers to an electrically inactive element, i.e., an element that does not provide electrical functionality.

Figure 5C:
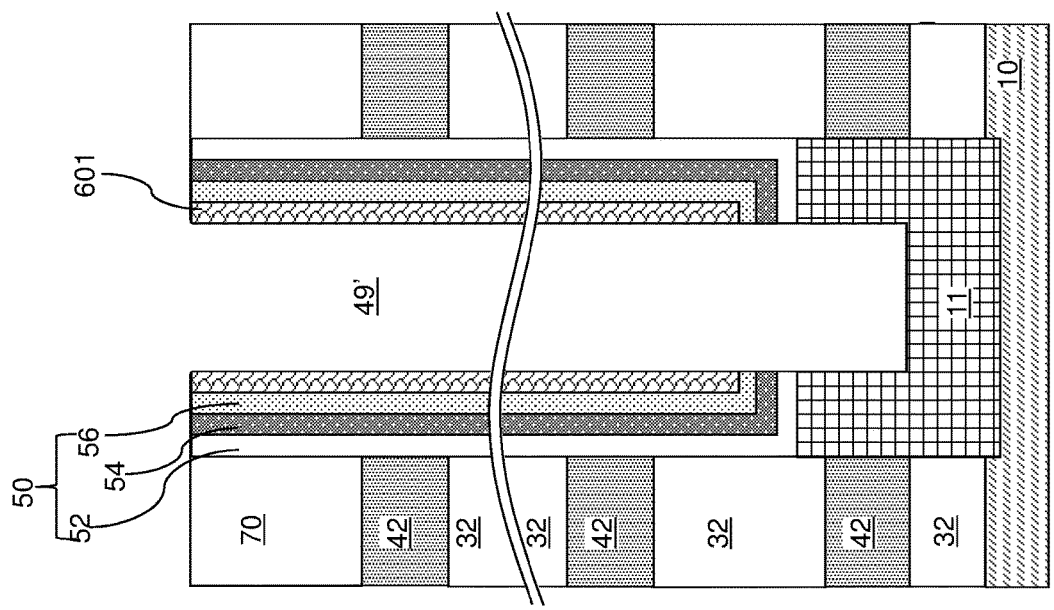

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Figure 5D:
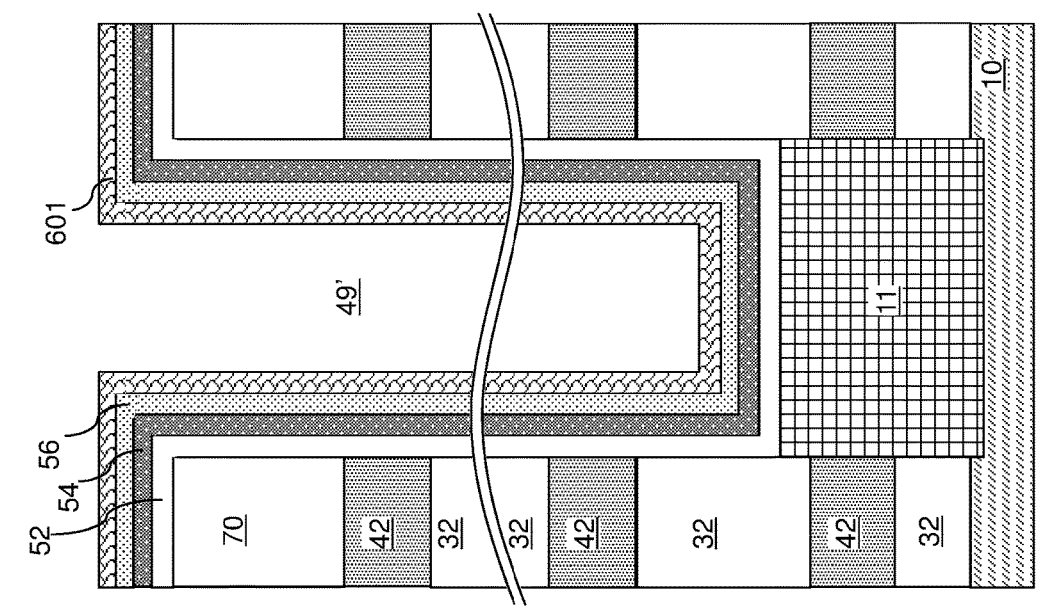

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5F:
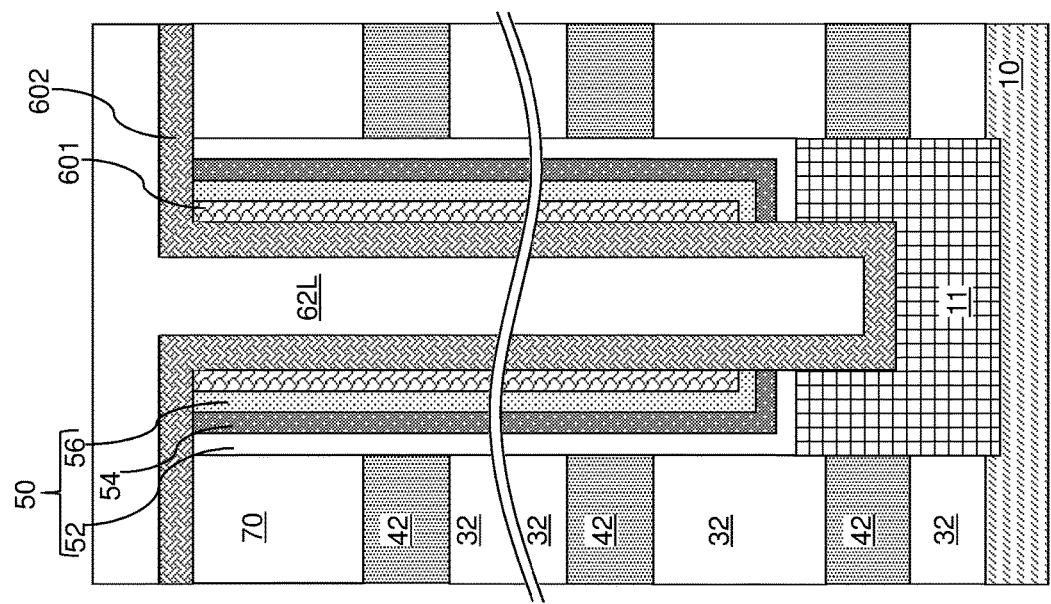
Figure 5E:
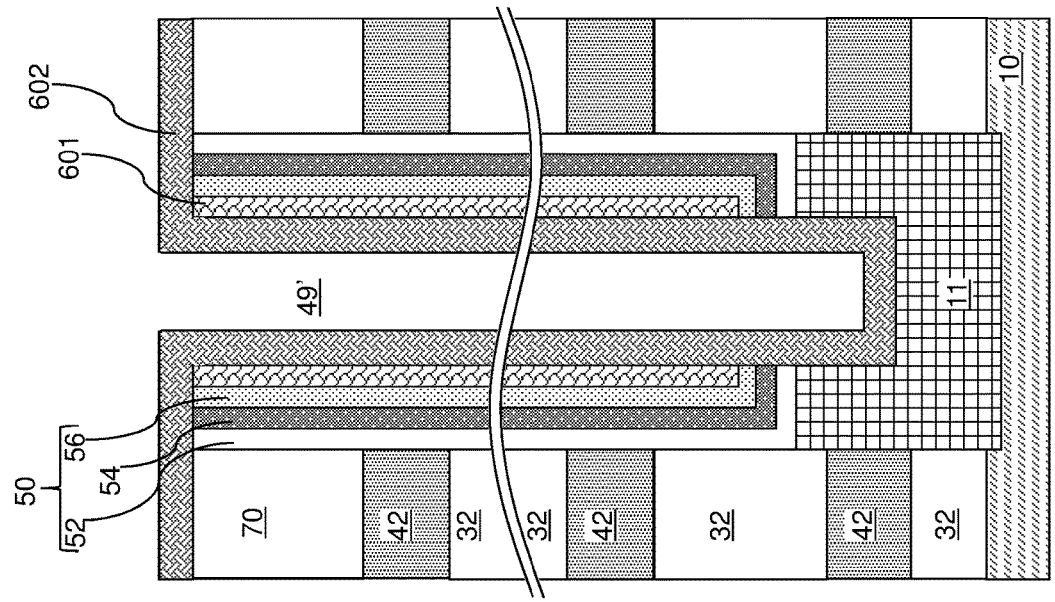

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. The top surface of each dielectric core 62 can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch. Each remaining portion of the second semiconductor channel layer 602 can be located entirety within a memory opening 49 or entirely within a support opening (19, 19').

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening (19, 19') fills the respective support openings (19, 19'), and constitutes a support pillar structure 20.

Figure 6:
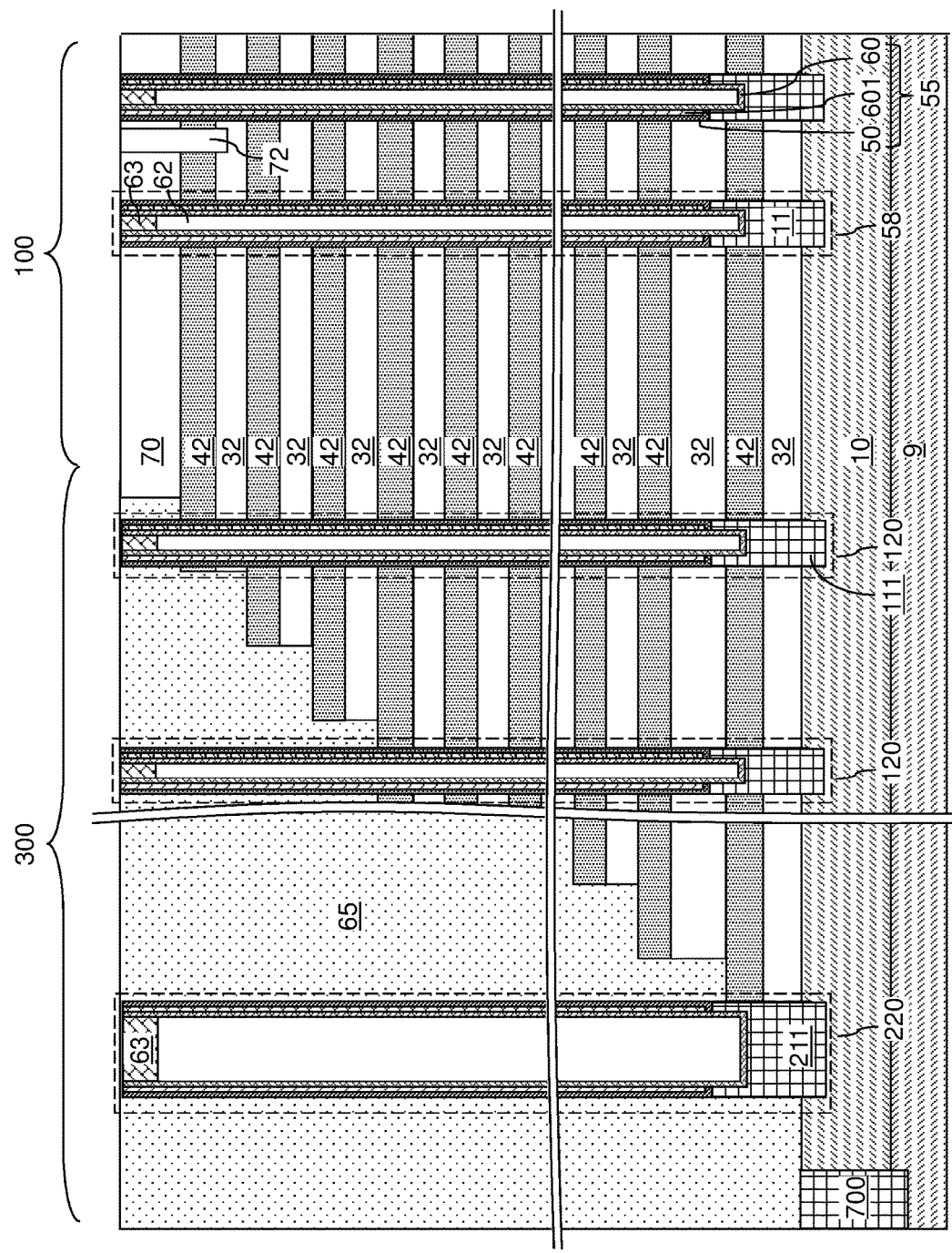
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structures (120, 220) within the memory openings 49 and the support openings (19, 19'), respectively. An instance of a memory opening fill structure 58 can be formed within each memory opening 49 of the structure of FIGS. 4A and 4B. Each memory opening fill structure 58 comprises a pedestal channel portion 11, a memory film 50, a vertical semiconductor channel 60, a dielectric core 62, and a drain region 63. An instance of a first-type support pillar structure 120 can be formed within each first-type support opening 19 of the structure of FIGS. 4A and 4B. An instance of a second-type support pillar structure 220 can be formed within each second-type support opening 19' of the structure of FIGS. 4A and 4B.

As discussed above, the selective deposition process forms the pedestal channel portions 11 in bottom regions of the memory openings 49, first dummy pedestal channel portions 111 in bottom regions of the first-type support openings 19, and second dummy pedestal channel portions 211 in bottom regions of the second-type support openings 19'. Each of the second dummy pedestal channel portions 211 contacts the retro-stepped dielectric material portion 65. Each region of the first dummy pedestal channel portions 111 located at a level of the bottommost insulating layer 32 is laterally spaced from the retro-stepped dielectric material portion 65.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Each first-type support pillar structure 120 includes a first dummy pedestal channel portion 111, a vertical semiconductor channel 60, and a memory film 50. Each vertical semiconductor channel 60 of a first-type support pillar structure 120 is a dummy vertical semiconductor channel, i.e., an electrically inactive component (i.e., a dummy component) having a same thickness and composition as the vertical semiconductor channels 60 of the memory opening fill structures 58. Each memory film 50 of a first-type support pillar structure 120 is a dummy memory film, i.e., an electrically inactive component having a same layer stack as the memory films 50 of the memory opening fill structures 58. The dummy memory film of each first-type support pillar structure 120 comprises an identical set of dielectric layers as a memory film 50. Each first-type support pillar structure 120 can include a dielectric core 62 and a drain region 63, which is a dummy drain region that is not electrically active.

Each second-type support pillar structure 220 includes a second dummy pedestal channel portion 211, a vertical semiconductor channel 60, and a memory film 50. Each vertical semiconductor channel 60 of a second-type support pillar structure 220 is a dummy vertical semiconductor channel, i.e., an electrically inactive component (i.e., a dummy component) having a same thickness and composition as the vertical semiconductor channels 60 of the memory opening fill structures 58. Each memory film 50 of a second-type support pillar structure 220 is a dummy memory film, i.e., an electrically inactive component having a same layer stack as the memory films 50 of the memory opening fill structures 58. The dummy memory film of each second-type support pillar structure 220 comprises an identical set of dielectric layers as a memory film 50. Each second-type support pillar structure 220 can include a dielectric core 62 and a drain region 63, which is a dummy drain region that is not electrically active (i.e., which is not electrically connected to a bit line which will be formed at a later step).

In one embodiment, each of the memory stack structures 55 comprises a respective memory film 50 and a respective vertical semiconductor channel 60 contacting an inner sidewall of the respective memory film 50. Each of the memory stack structures 55 overlies a respective pedestal channel portion 11, which contacts a bottom surface of the memory film 50 in an overlying memory stack structure 55 and contacts a top surface of the semiconductor material layer 10. In one embodiment, each second dummy pedestal channel portion 211 includes a straight sidewall that continuously contacts the retro-stepped dielectric material portion 65 between a top surface of the semiconductor material layer 10 and a top surface of the second dummy pedestal channel portion 211.

Figure 7A:
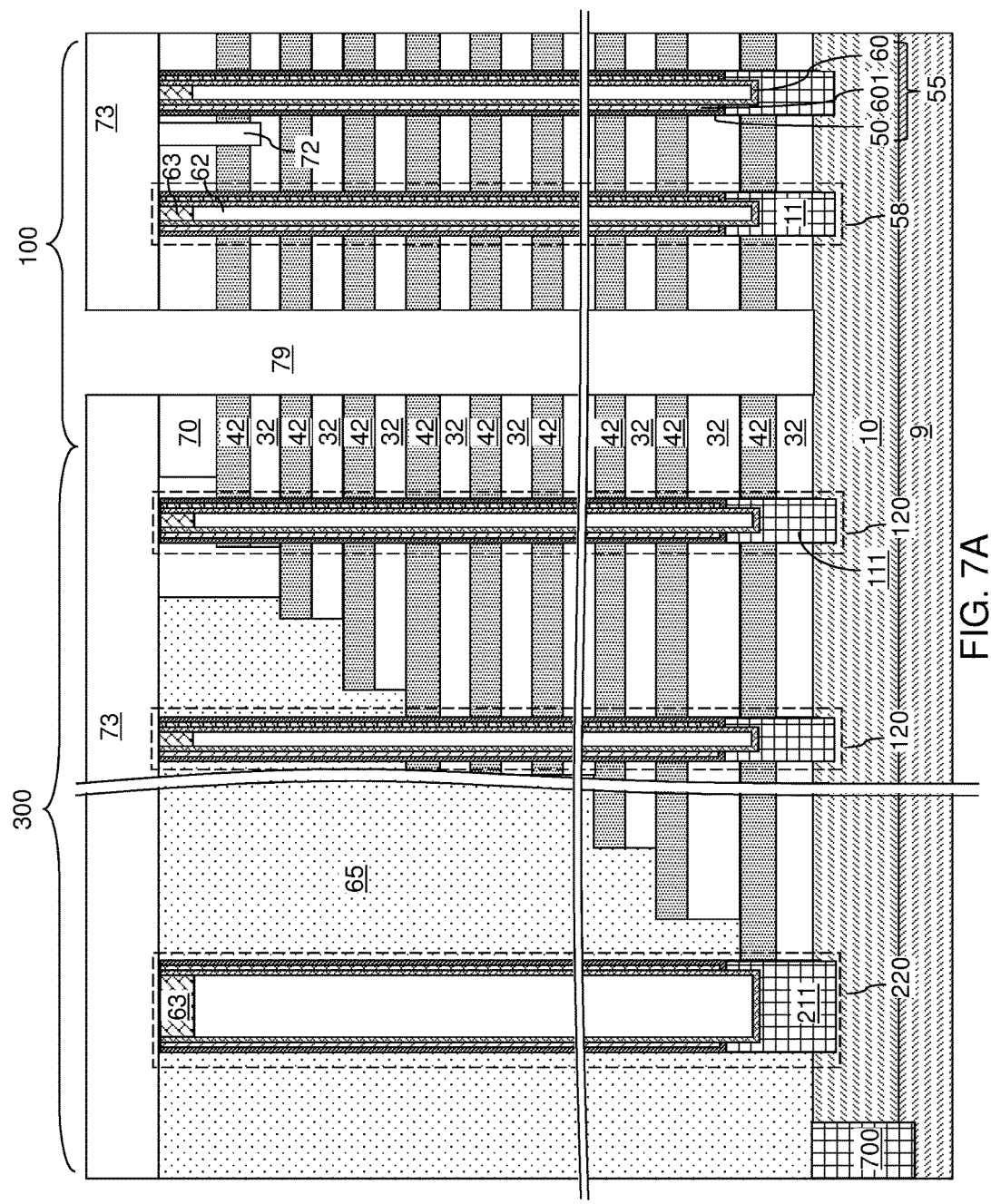
FIG. 7A is a schematic vertical cross-sectional view of the exemplary structure after formation of backside trenches according to an embodiment of the present disclosure.
Figure 7B:
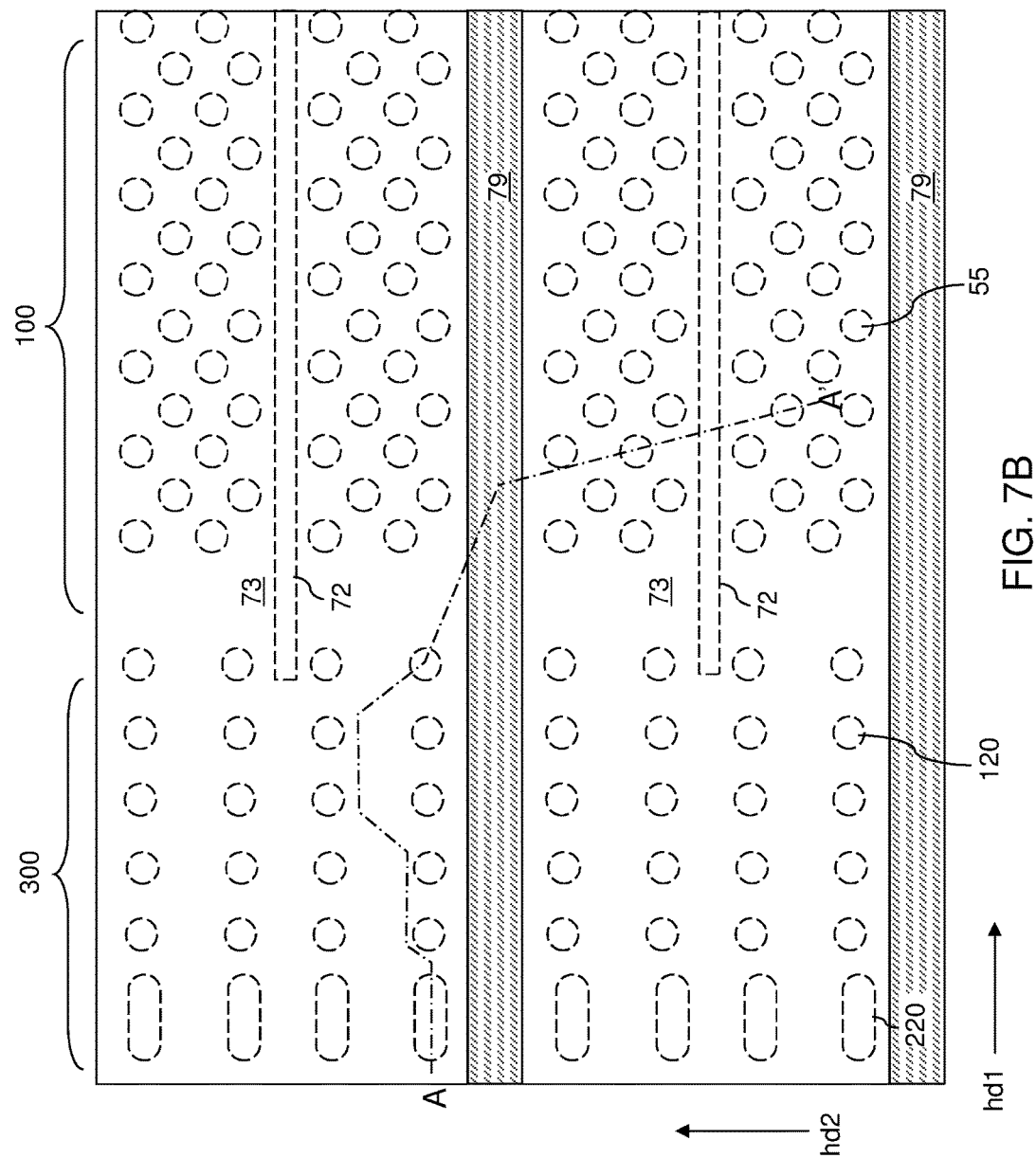
FIG. 7B is a partial see-through top-down view of the exemplary structure of FIG. 7A. The vertical plane A-A' is the plane of the vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures (120, 220). The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along the first horizontal direction hd1 and can be laterally spaced apart among one another along the second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8A:
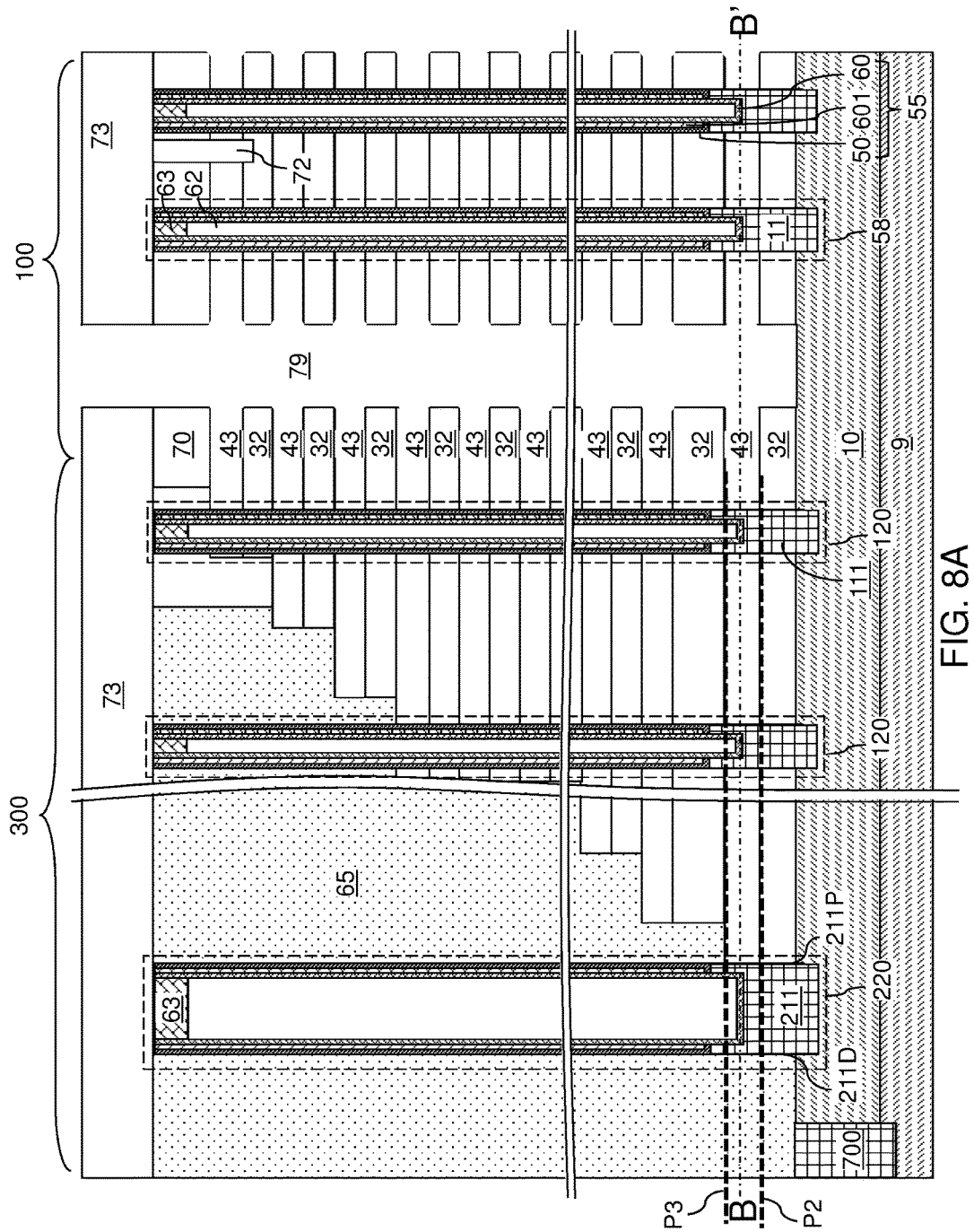
FIG. 8A is a schematic vertical cross-sectional view of the exemplary structure after formation of backside recesses according to an embodiment of the present disclosure.
Figure 8B:
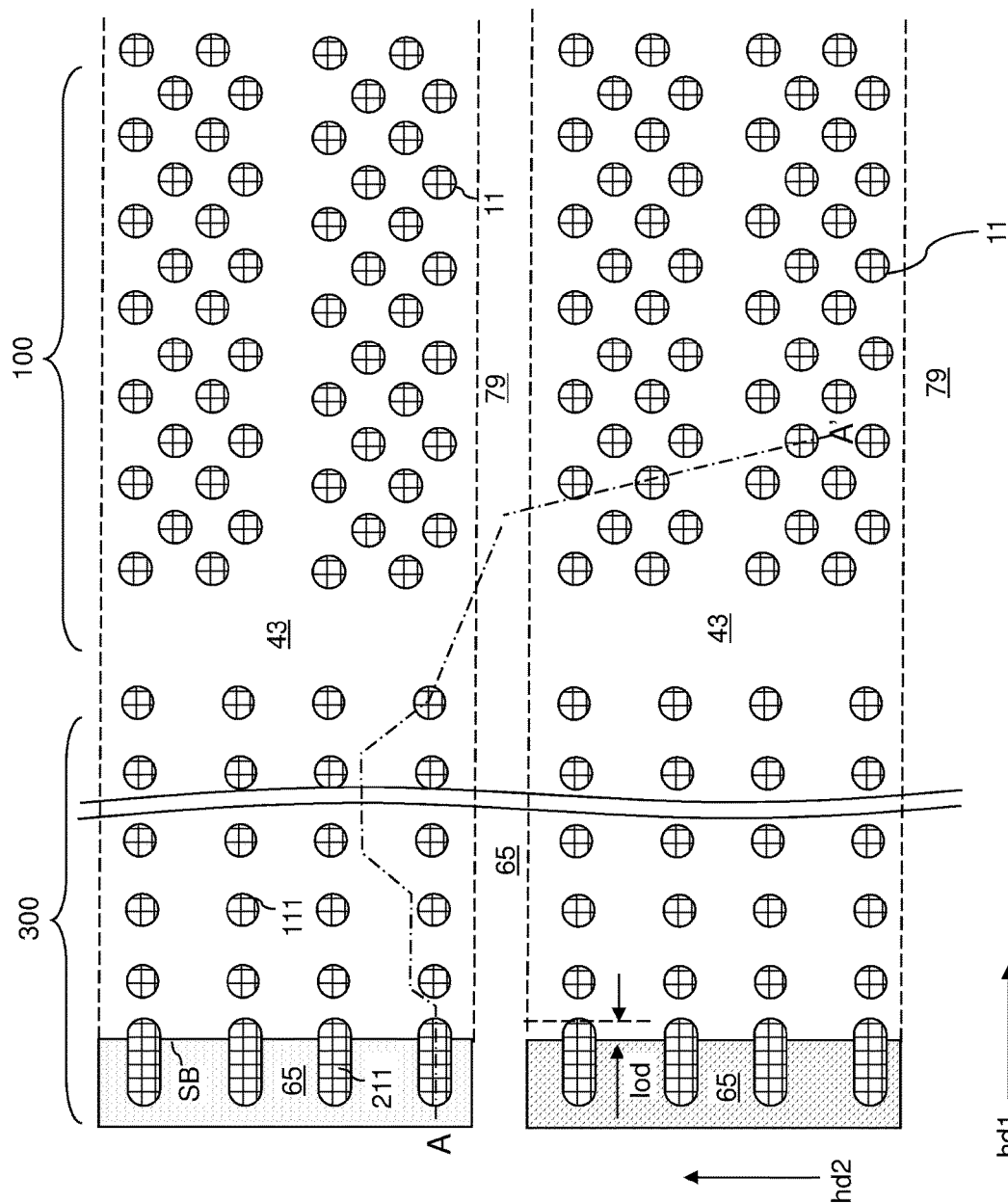
FIG. 8B is a horizontal cross-sectional view of the exemplary structure along the horizontal plane B-B' of FIG. 8A. The vertical plane A-A' is the plane of the vertical cross-sectional view of FIG. 8A.

Referring to FIGS. 8A and 8B, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure (120, 220), the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

The entire portion of each sidewall of the pedestal channel portions 11 located between a horizontal plane P3 including top surface of a bottommost backside recess 43 and a horizontal plane P3 including a bottom surface of the bottommost backside recess 43 is physically exposed to the bottommost backside recess 43. The entire portion of each sidewall of the first dummy pedestal channel portions 111 located between the horizontal planes P2 and P3 is physically exposed to the bottommost backside recess 43. Only a proximal portion 211P of each sidewall of the second dummy pedestal channel portions 211, which is located between the horizontal planes P2 and P3 is more proximal to the memory array region 100 than the bottommost vertical step SB is to the memory array region 100. The proximal portion 211P of each sidewall of the second dummy pedestal channel portions 211 is physically exposed to the bottommost backside recess 43. Each distal portion 211D of the sidewalls of the second dummy pedestal channel portions 211, which is located between the horizontal planes P2 and P3, contacts the retro-stepped dielectric material portion 65 and is not physically exposed to the bottommost backside recess 43.

Thus, a cylindrical sidewall of each pedestal channel portion 11 is physically exposed to the bottommost backside recess 43 between the horizontal plane P3 including top surface of a bottommost backside recess 43 and the horizontal plane P2 including a bottom surface of the bottommost backside recess 43. A cylindrical sidewall of each first dummy pedestal channel portion 111 is physically exposed to the bottommost backside recess 43 between the horizontal planes P2 and P3. A proximal sidewall 211P of each second dummy pedestal channel portion 211 is physically exposed to the bottommost backside recess 43 between the horizontal planes P2 and P3. A distal sidewall 211D of each second dummy pedestal channel portion 211 is not physically exposed to the bottommost backside recess 43 between the horizontal planes P2 and P3, and contacts a sidewall of the retro-stepped dielectric material portion 65. By forming each second support opening 19' to cut through a bottommost vertical step SB at the processing steps of FIGS. 4A and 4B, the proximal sidewall 211P of each second dummy pedestal channel portion 211 is physically exposed, while the distal sidewall 211D of each second dummy pedestal channel portion 211 is not physically exposed to the bottommost backside recess 43.

Figure 8C:
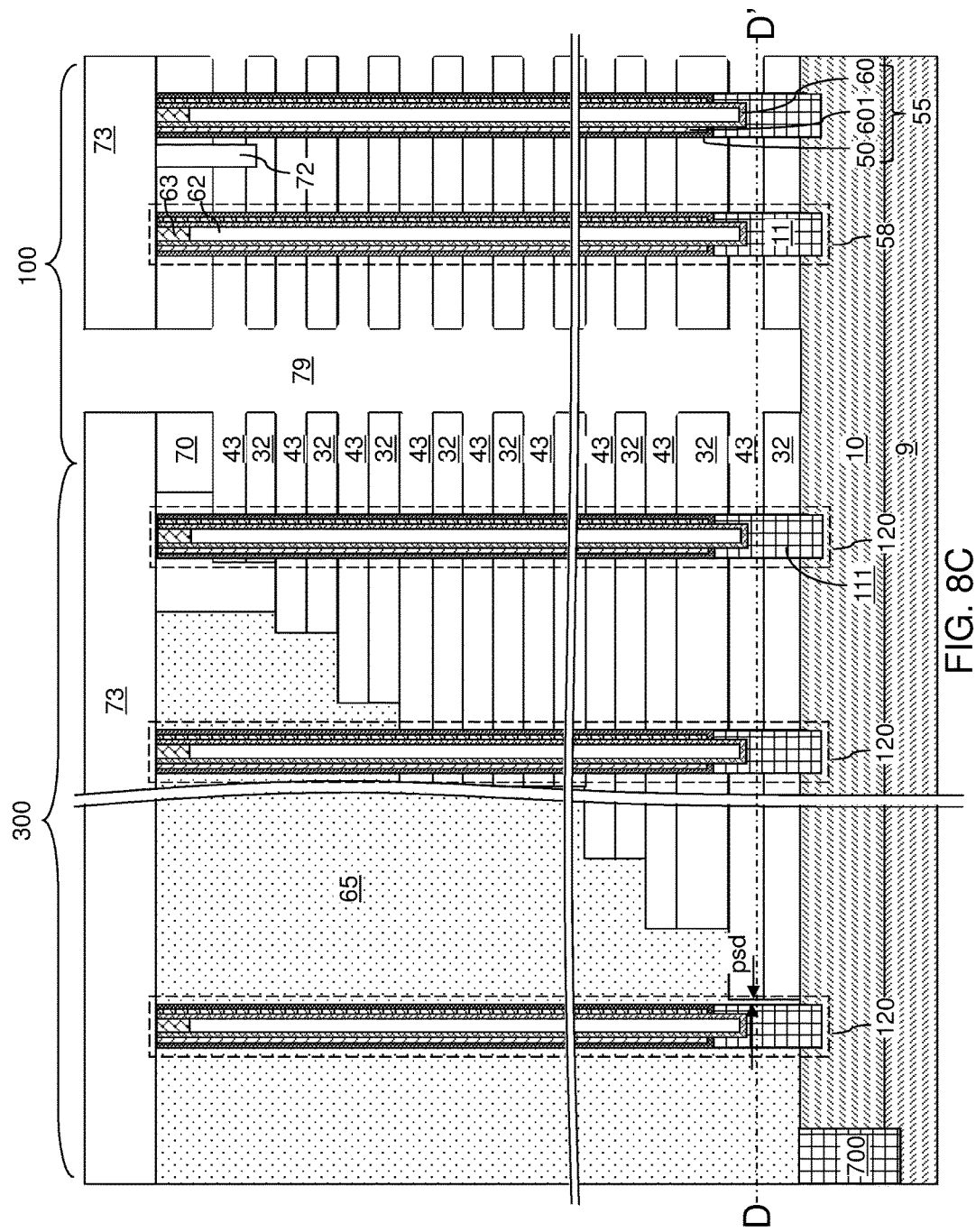
FIG. 8C is a schematic vertical cross-sectional view of a comparative exemplary structure after formation of backside recesses.
Figure 8D:
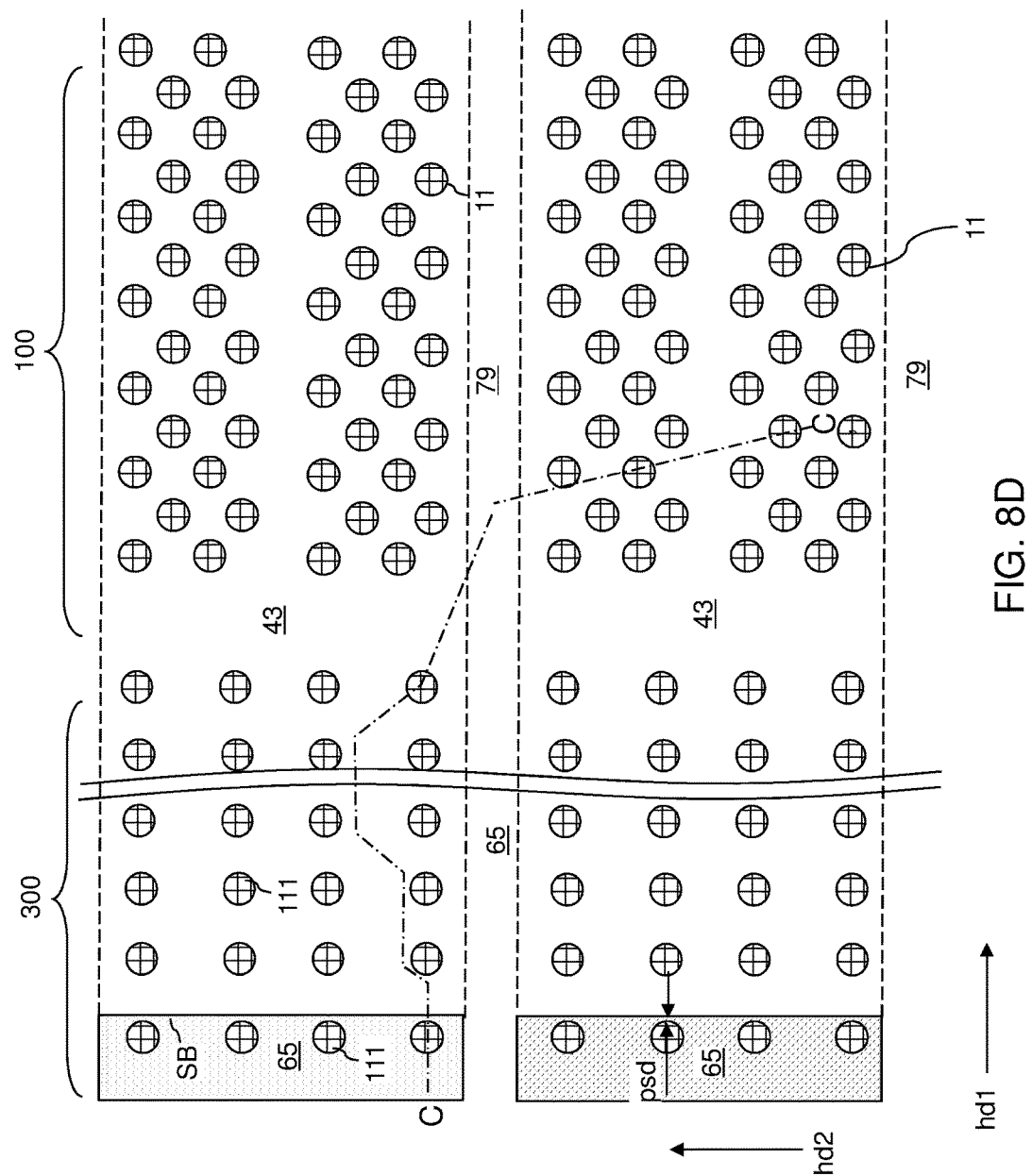
FIG. 8D is a horizontal cross-sectional view of the exemplary structure along the horizontal plane D-D' of FIG. 8C. The vertical plane C-C' is the plane of the vertical cross-sectional view of FIG. 8C.

FIGS. 8C and 8D illustrate the comparative exemplary structure of FIGS. 4C and 4D after performing the processing steps of FIGS. 8A and 8B thereupon. As discussed above, only memory openings 49 and first-type support openings 19 are provided in the comparative exemplary structure of FIGS. 4C and 4D, and second-type support openings 19' are not present in the comparative exemplary structure of FIGS. 4A and 4D. Correspondingly, memory opening fill structures 58 and first-type support pillar structures 120 are present in the comparative exemplary structure of FIGS. 8C and 8D, and second-type support pillar structures 220 are not present in the comparative exemplary structure of FIGS. 8C and 8D.

The physical separation distance "psd" between a first-type support pillar structures 120 that is most proximal to the bottommost vertical step SB of the stepped surfaces can randomly vary with overlay variations introduced during formation of patterns for the first-type support openings 19 and etch bias variations during formation of the first-type support openings 19 along the first horizontal direction hd1, i.e., the horizontal direction that is perpendicular to the vertical steps S of the stepped surfaces. Frequently, one or more of the first-type support pillar structures 120 that are proximal to the bottommost vertical step SB of the stepped surfaces can have a physical separation distance "psd" that is prone to dielectric breakdown during operation of a three-dimensional memory device including the memory stack structures 55. The physical separation distance "psd" can be in a range from 0 nm to 10 nm, such as from 0.5 nm to 2 nm. It should be noted that the physical separation distance "psd" can be a statistically variable quantity that varies from die to die, wafer to wafer, and lot to lot during a manufacturing process. Some semiconductor devices may be manufactured with a sufficiently great physical separation distance "psd" to prevent dielectric breakdown, and some other semiconductor devices may be manufactured such that the physical separation distance is zero (in which case formation of an oxide portion prevents electrical shorts between a bottommost electrically conductive layer to be formed and a first dummy pedestal channel portion 111). However, statistical occurrence of semiconductor dies in which the physical separation distance "psd" is in a range that allows dielectric breakdown induces yield depression through occurrence of electrical shorts between a bottommost electrically conductive layer (e.g., gate electrode of the source select transistor) to be formed and a first dummy pedestal channel portion 111 that is proximal to the bottommost vertical step SB in semiconductor devices derived from the comparative exemplary structure of FIGS. 8C and 8D.

Figure 9A:
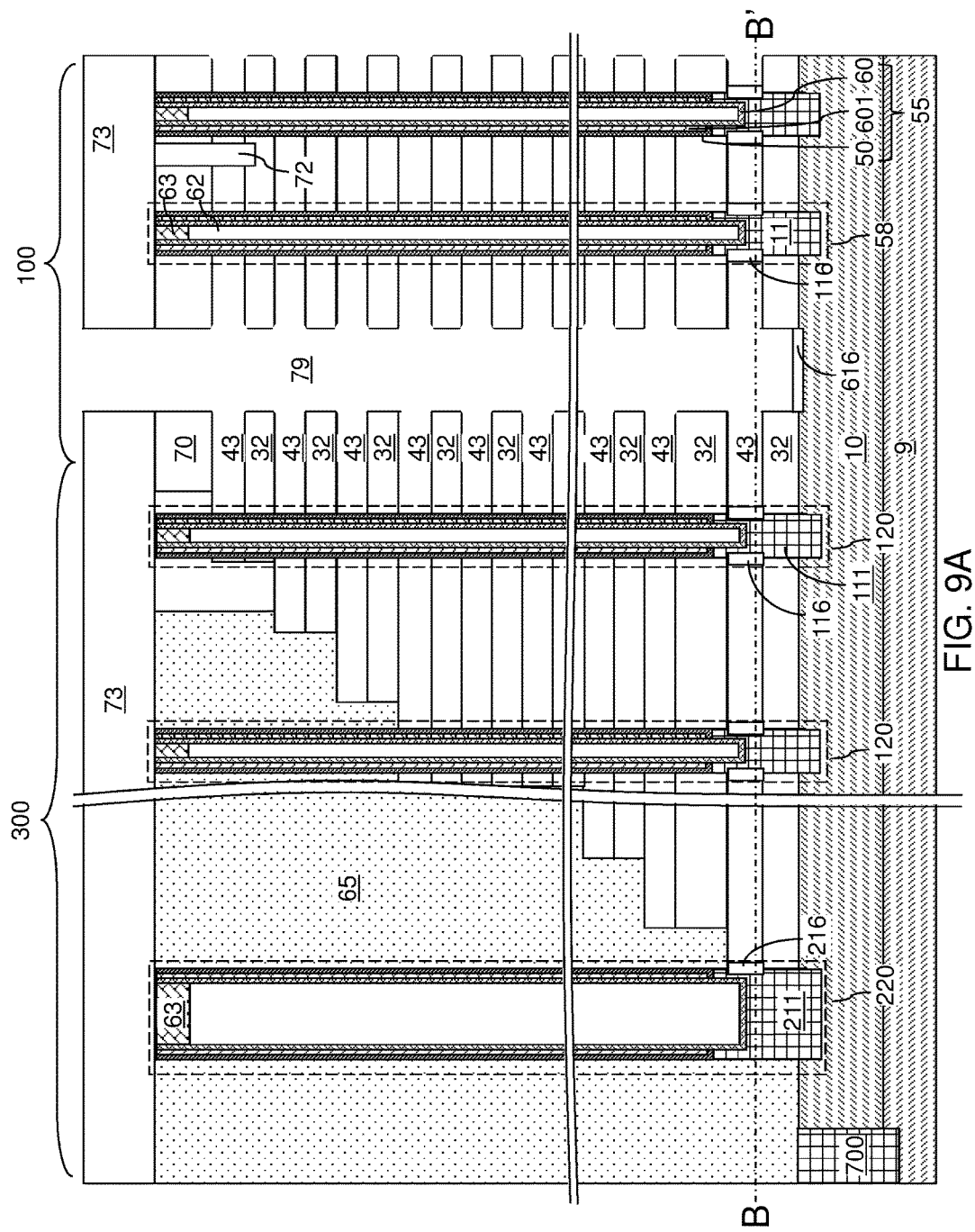
FIG. 9A is a schematic vertical cross-sectional view of the exemplary structure after an oxidation process that forms tubular semiconductor oxide spacers and vertical semiconductor oxide plates according to an embodiment of the present disclosure.
Figure 9B:
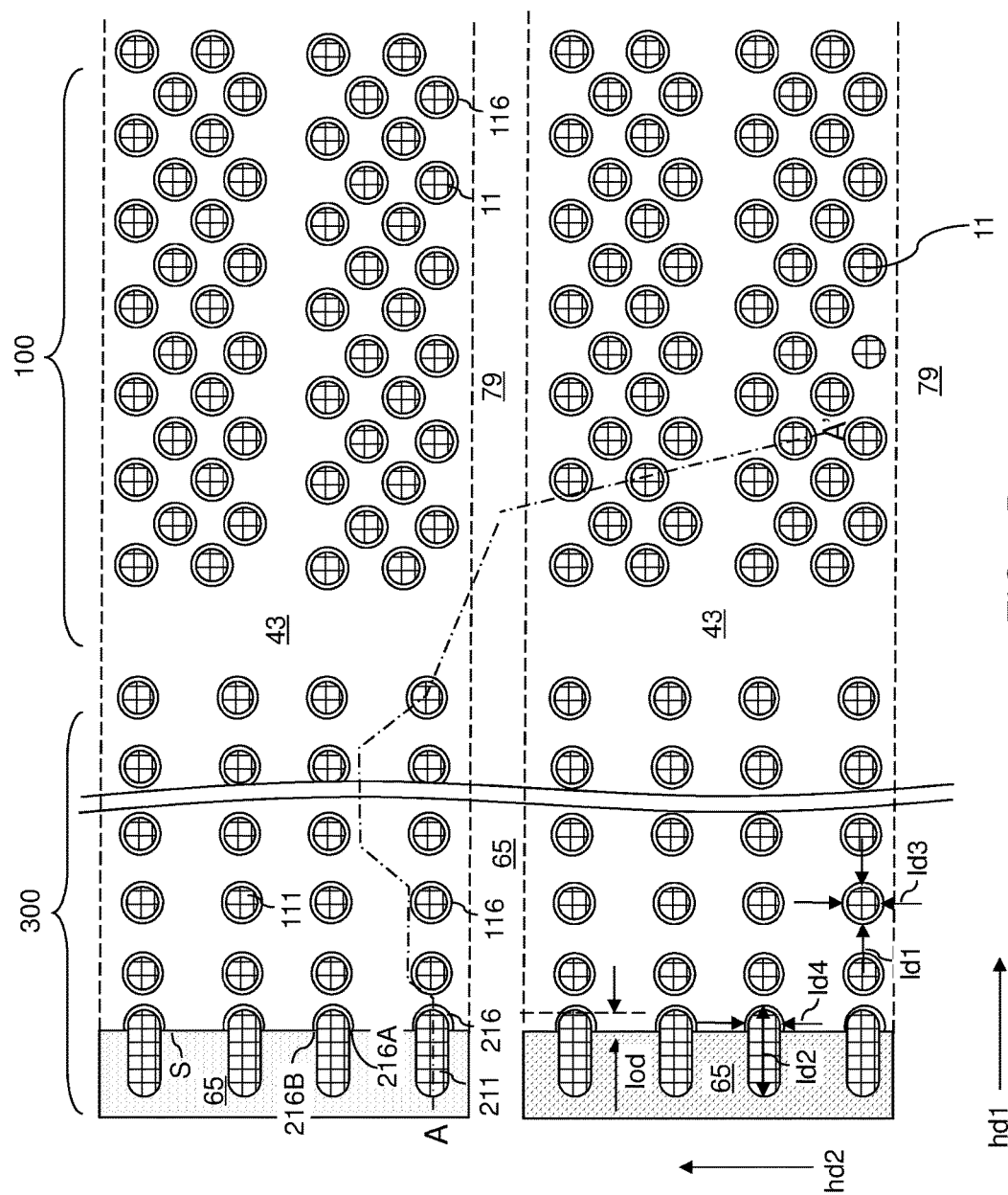
FIG. 9B is a horizontal cross-sectional view of the exemplary structure along the horizontal plane B-B' of FIG. 9A. The vertical plane A-A' is the plane of the vertical cross-sectional view of FIG. 9A.

Referring to FIGS. 9A, 9B, and 10A, physically exposed surface portions of the pedestal channel portions 11, the first dummy pedestal channel portions 111, the second dummy pedestal channel portions 211, and the semiconductor material layer 10 of the exemplary structure of FIGS. 8A and 8B can be converted into dielectric material portions by thermal oxidation and/or plasma oxidation of the semiconductor materials into dielectric materials. For example, thermal oxidation and/or plasma oxidation can be employed to convert a surface portion of each pedestal channel portion 11 and each first dummy pedestal channel portion 111 into a tubular semiconductor oxide spacer 116, and to convert each physically exposed surface portion of the semiconductor material layer 10 into a horizontal semiconductor oxide plate 616. The tubular semiconductor oxide spacer 116 around each pedestal channel portion 11 functions as a gate electric for a source select transistor of the memory device. The tubular semiconductor oxide spacers 116 and horizontal semiconductor oxide plates 616 function as dummy separator dielectrics which prevent electrical shorts between the gate electrode of the source select transistor and the respective dummy pedestal channel portions (111, 211). In one embodiment, each tubular semiconductor oxide spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular semiconductor oxide spacers 116 include a dielectric material that includes the same semiconductor element as the pedestal channel portions 11 and the first dummy pedestal channel portions 111 and additionally includes at least one non-metallic element such as oxygen and/or nitrogen such that the material of the tubular semiconductor oxide spacers 116 is a dielectric material. In one embodiment, the tubular semiconductor oxide spacers 116 can include a dielectric oxide, a dielectric nitride, or a dielectric oxynitride (e.g., silicon oxide, silicon nitride or silicon oxynitride) of the semiconductor material (e.g., silicon) of the pedestal channel portions 11. Likewise, each horizontal semiconductor oxide plate 616 includes a dielectric material that includes the same semiconductor element as the semiconductor material layer and additionally includes at least one non-metallic element such as oxygen and/or nitrogen such that the material of the horizontal semiconductor oxide plates 616 is a dielectric material. In one embodiment, the horizontal semiconductor oxide plates 616 can include a dielectric oxide, a dielectric nitride, or a dielectric oxynitride (e.g., silicon oxide, silicon nitride or silicon oxynitride) of the semiconductor material (e.g., silicon) of the semiconductor material layer 10.

Concurrently with formation of the tubular semiconductor oxide spacers 116, surface portions of the second dummy pedestal channel portions 211 beneath the physically exposed proximal sidewalls of the second dummy pedestal channel portions 211 are converted into vertical semiconductor oxide plates 216. Each vertical semiconductor oxide plate 216 can have a same lateral thickness as the tubular semiconductor oxide spacers 116. While each tubular semiconductor oxide spacer 116 laterally surrounds a respective pedestal channel portion 11 or a respective first dummy pedestal channel portion 111, the vertical semiconductor oxide plates 216 does not completely laterally surround any second dummy pedestal channel portion 211. A distal sidewall 211D of each second dummy pedestal channel portion 211 contacts the retro-stepped dielectric material portion 65, and a laterally recessed proximal sidewall 211P of each second dummy pedestal channel portion 211 contacts a respective vertical semiconductor oxide plate 216. Each vertical semiconductor oxide plate 216 can be topologically homeomorphic to a sphere. Each second dummy pedestal channel portion 211 is laterally spaced from the bottommost backside recess 43 by a respective vertical semiconductor oxide plate 216. Inner and outer sidewalls of each vertical semiconductor oxide plate 216 can extend vertically with a straight or curved profile, and can extend horizontally with a respective curvature around the respective dummy pedestal channel portion 211. In one embodiment, each vertical semiconductor oxide plate 216 can include a respective pair of end surfaces (216A, 216B) that contact the retro-stepped dielectric material portion 65. Each sidewall of the end surfaces (216A, 216B) of the vertical semiconductor oxide plates 216 that contact the retro-stepped dielectric material portion 65 can be substantially coplanar with the bottommost vertical step SB of the stepped surfaces.

Generally, the oxidation process forms a tubular semiconductor oxide spacer 116 that is topologically homeomorphic to a torus around each first dummy pedestal channel portion 111 by oxidizing a surface portion of each first dummy pedestal channel portion 111, and a vertical semiconductor oxide plate 216 that is topologically homeomorphic to a sphere on each second dummy pedestal channel portion 211 by oxidizing a surface portion of each second dummy pedestal channel portion 211. Each of the pedestal channel portions 11 and the first dummy pedestal channel portions 111 are spaced from the retro-stepped dielectric material portion 65 by the bottommost backside recess 43. Each tubular semiconductor oxide spacer 116 on a first dummy pedestal channel portion 111 is incorporated into a respective first-type support pillar structure 120, and each vertical semiconductor oxide plate 216 on a pedestal channel portion 211 is incorporated into a respective second-type support pillar structure 220. Each tubular semiconductor oxide spacer 116 on a pedestal channel portion 11 is incorporated into a respective memory opening fill structure 58.

Figure 9C:
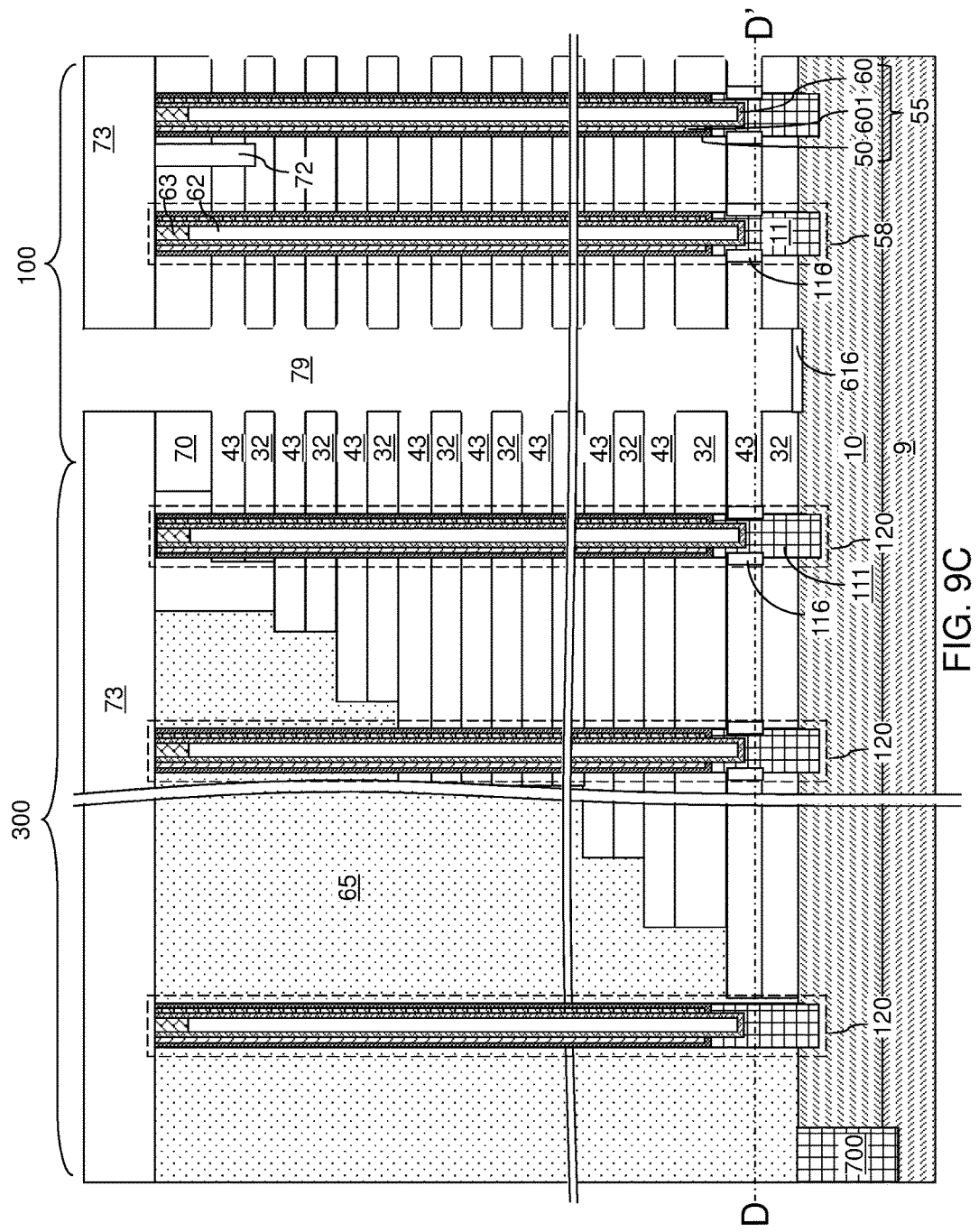
FIG. 9C is a schematic vertical cross-sectional view of a comparative exemplary structure after an oxidation process.
Figure 9D:
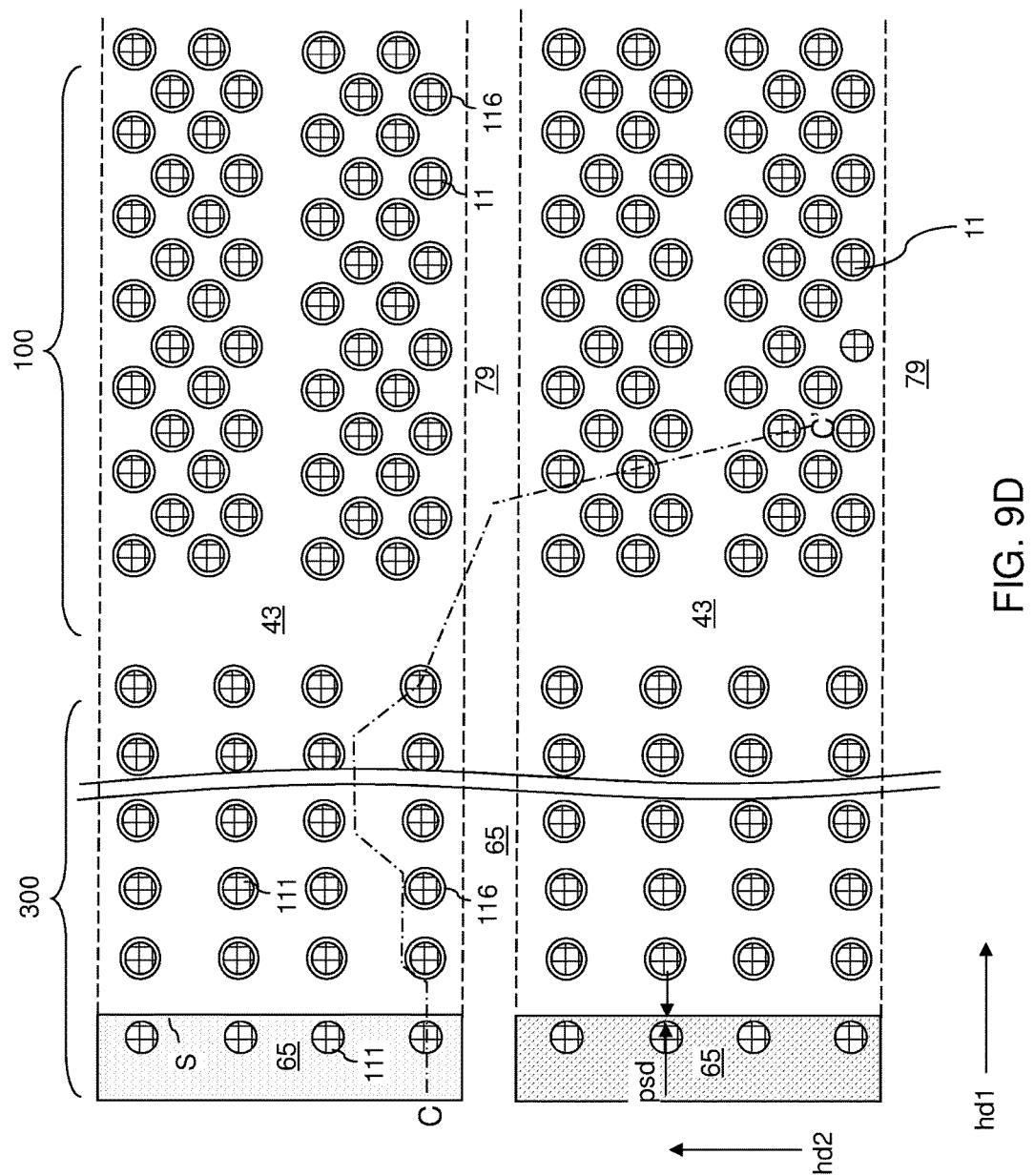
FIG. 9D is a horizontal cross-sectional view of the exemplary structure along the horizontal plane D-D' of FIG. 9C. The vertical plane C-C' is the plane of the vertical cross-sectional view of FIG. 9C.

FIGS. 9C and 9D illustrate the comparative exemplary structure of FIGS. 8C and 8D after performing the processing steps of FIGS. 9A and 9B thereupon. For the first-type support pillar structures 120 that are not physically exposed to the bottommost backside recess 43, an oxidation process does not form a sufficiently thick semiconductor oxide material portion because diffusion of oxygen through the retro-stepped dielectric material portion 65 is limited. Thus, tubular semiconductor oxide spacer 116 are formed only around pedestal channel portions 11 and the first dummy pedestal channel portions 111 that are physically exposed to the bottommost backside recess 43, but are not formed around dummy pedestal channel portions 111 that are more distal from the memory array region 100 than the bottommost vertical step SB. Thus, one or more of the first-type support pillar structures 120 that are more distal from the memory array region 100 than the bottommost vertical step SB is from the memory array region 100 can have a physical separation distance "psd" that is prone to dielectric breakdown during operation of a three-dimensional memory device including the memory stack structures 55 as discussed above.

Referring to FIG. 10B, a backside blocking dielectric layer 44 can be optionally formed in the backside recesses 43 of the exemplary structure of FIGS. 9A, 9B, and 10A. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular semiconductor oxide spacers 116 and the horizontal dielectric plate 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the horizontal dielectric plate 616. A backside cavity 79' is present within the portion of each backside trench 79 that is not filled with the backside blocking dielectric layer 44.

Referring to FIG. 10C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 11:
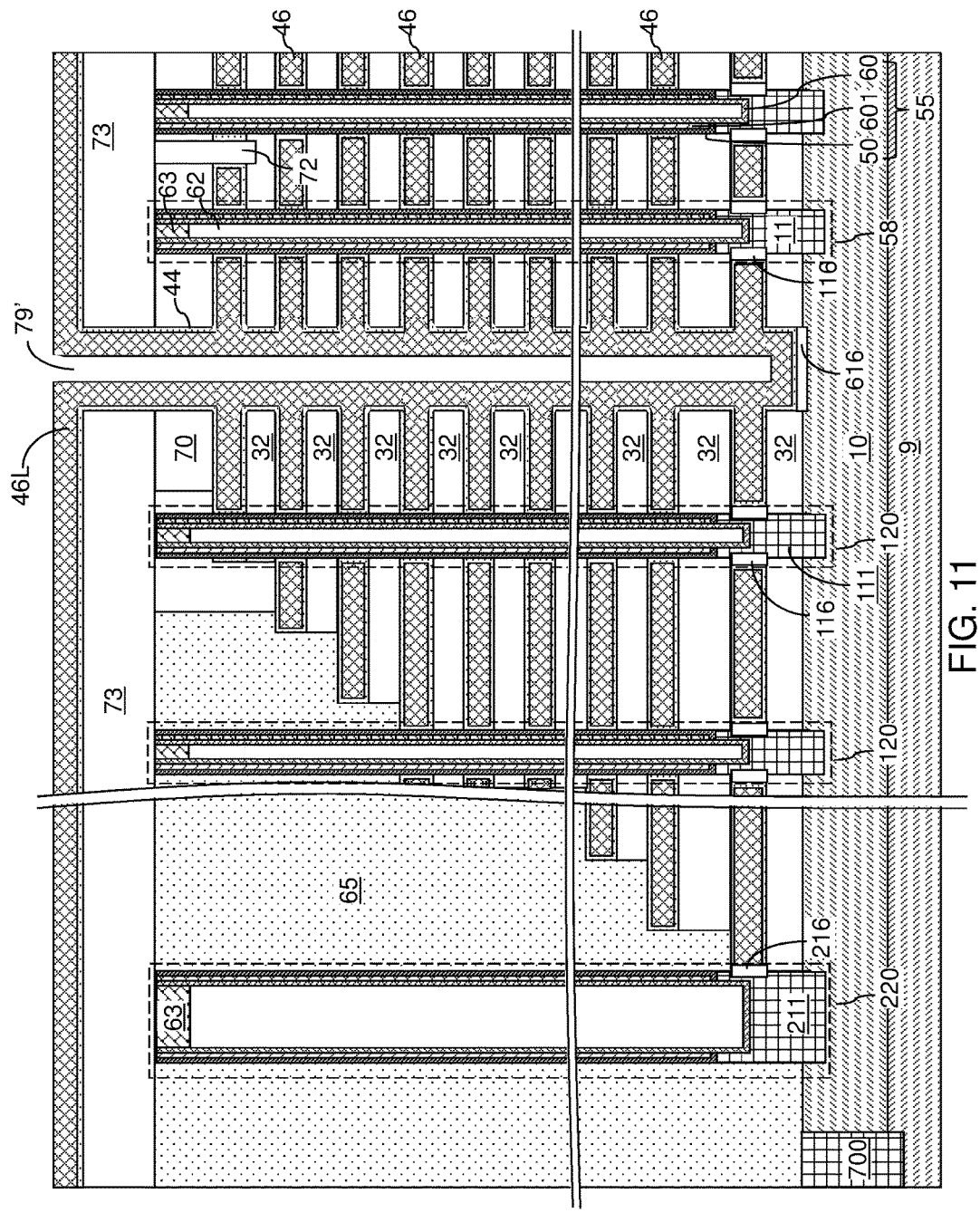
FIG. 11 is a schematic vertical cross-sectional view of the exemplary structure at the processing step of FIG. 10D.

Referring to FIGS. 10D and 11, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular semiconductor oxide spacer 116 laterally surrounds each pedestal channel portion 11. A bottommost electrically conductive layer 46 laterally surrounds each tubular semiconductor oxide spacer 116 upon formation of the electrically conductive layers 46.

Referring to FIGS. 12A-12D, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The horizontal dielectric plates 616 can be removed during removal of the continuous electrically conductive material layer 46L. A backside cavity is present within each backside trench 79.

Figure 12A:
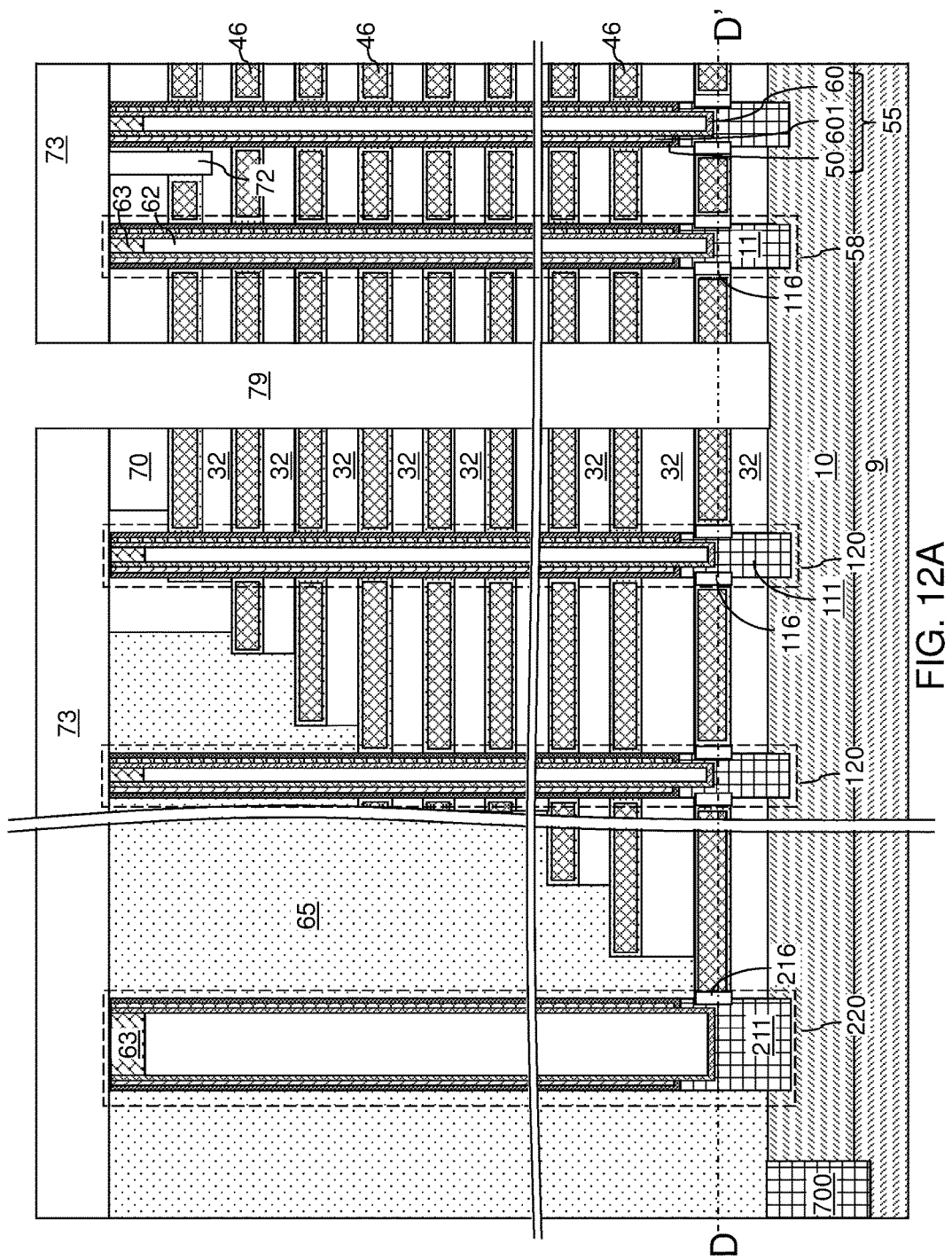
FIG. 12A is a schematic vertical cross-sectional view of the exemplary structure after removal of a deposited conductive material from within the backside trenches according to an embodiment of the present disclosure.
Figure 12B:
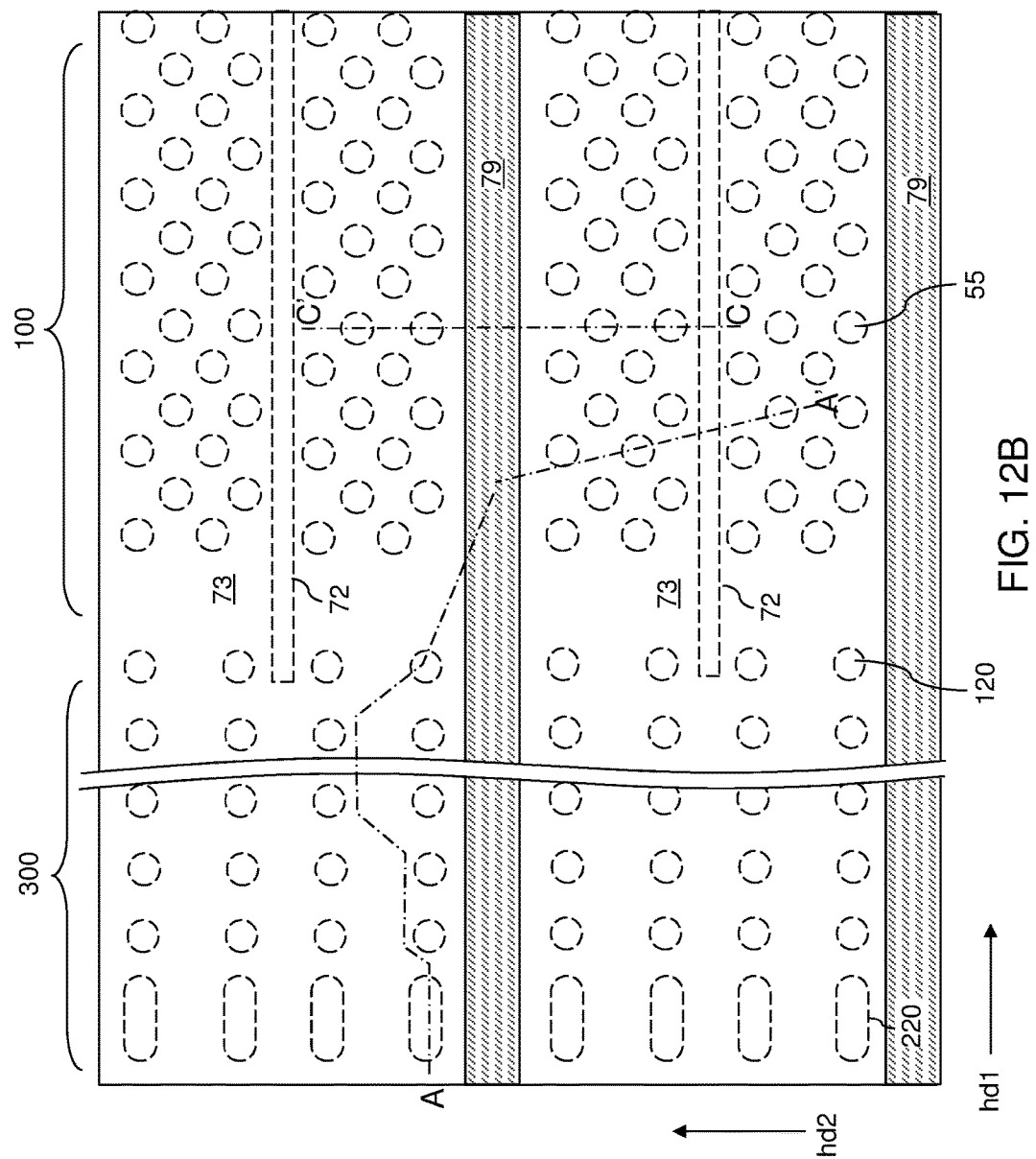
FIG. 12B is a top-down view of the exemplary structure of FIG. 12A. The vertical plane A-A' is the plane of the vertical cross-sectional view of FIG. 12A.
Figure 12C:
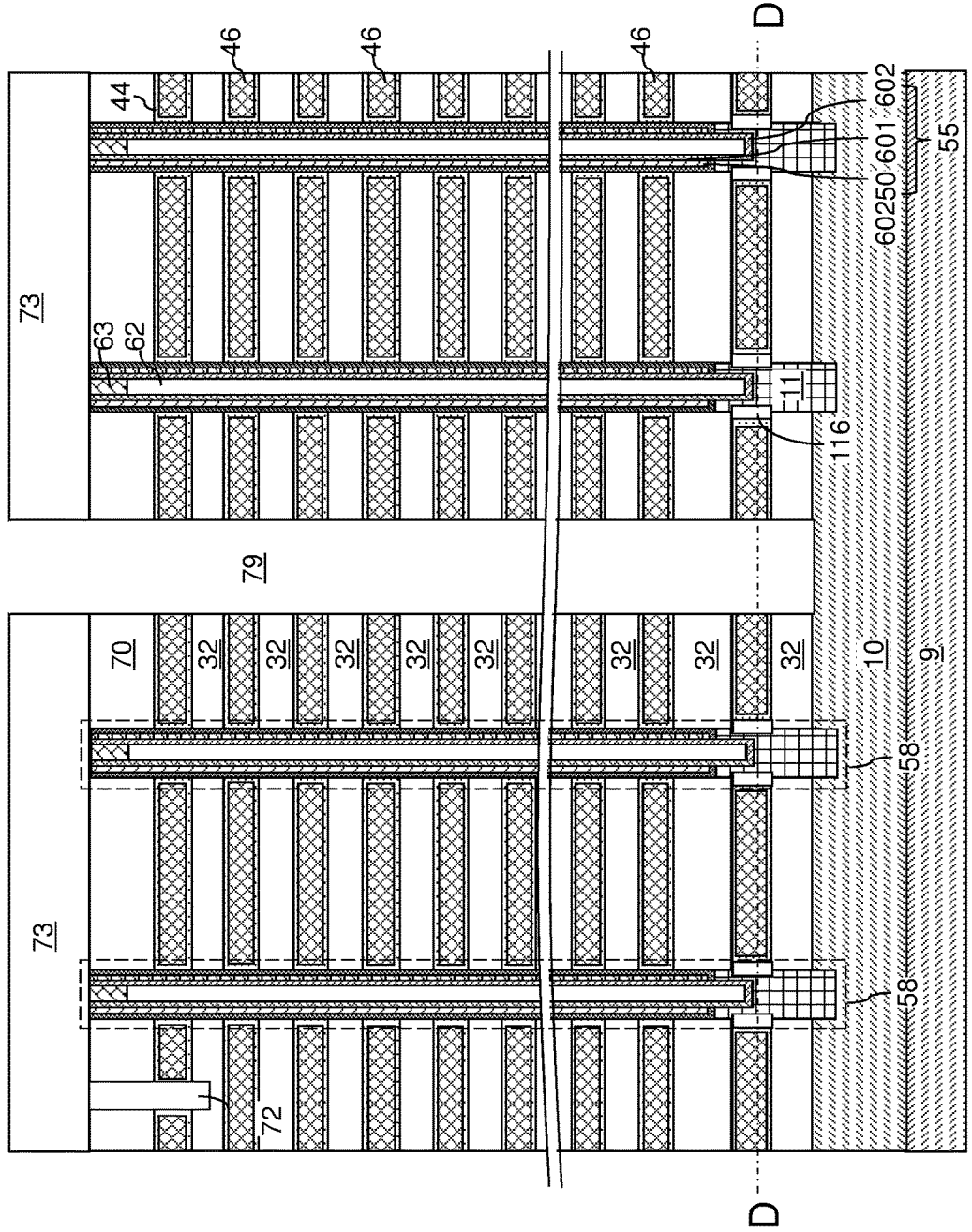
FIG. 12C is a vertical cross-sectional view of the exemplary structure of FIGS. 12A and 12B along the vertical cross-sectional plane C-C' in FIG. 12B.
Figure 12D:
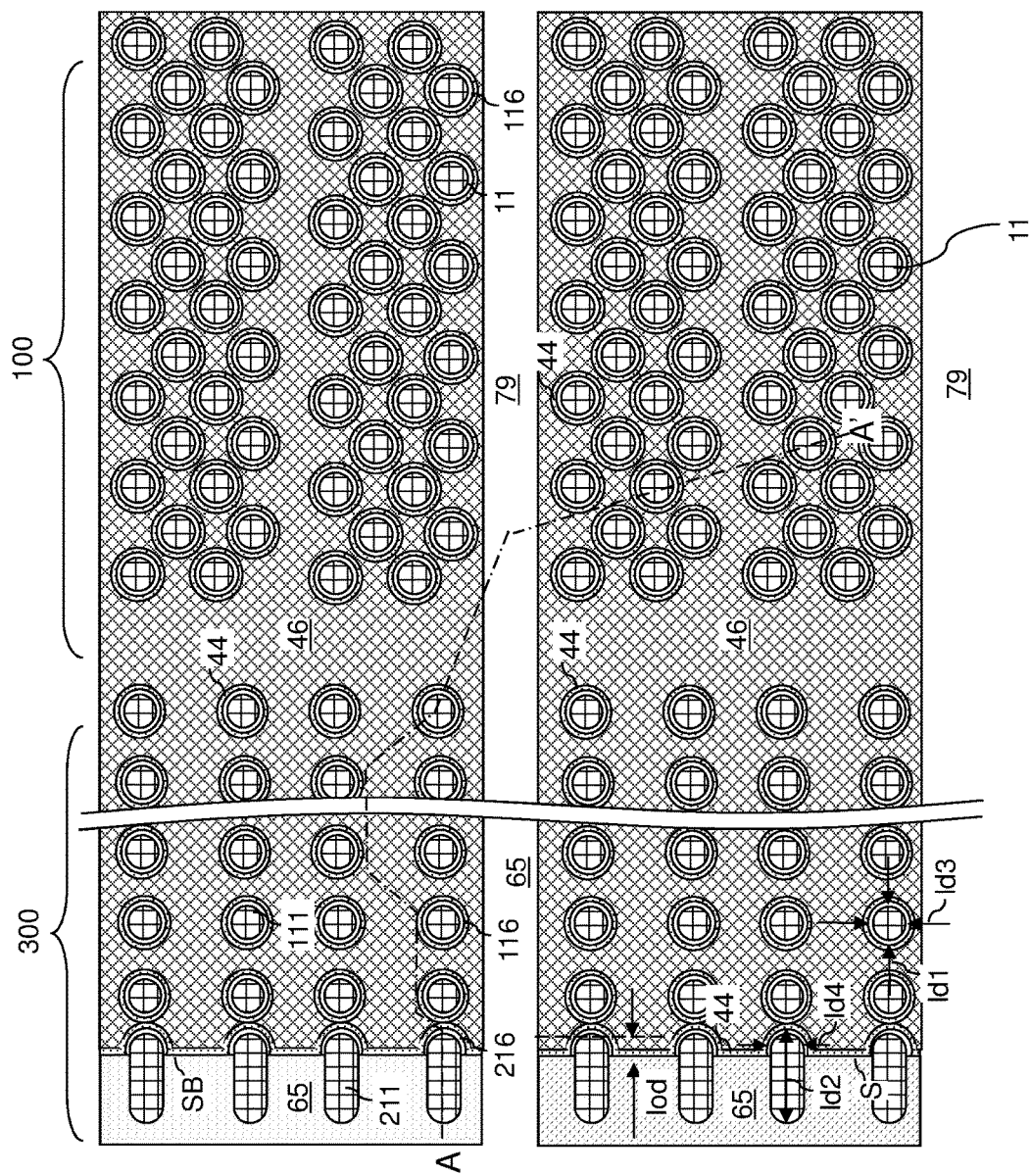
FIG. 12D is a horizontal cross-sectional view of the exemplary structure along the horizontal plane D-D' of FIG. 12A. The vertical plane A-A' is the plane of the vertical cross-sectional view of FIG. 12A.

As shown in FIG. 12D, each first-type support pillar structure 120 can have a first maximum lateral dimension ld1 along the first horizontal direction hd1, which is the horizontal direction that is perpendicular to the bottommost vertical step SB of the stepped surfaces of the alternating stack (32, 46) that contact stepped bottom surfaces of the retro-stepped dielectric material portion 65. Each second-type support pillar structure 220 can have a second maximum lateral dimension ld2 along the first horizontal direction hd1. The second maximum lateral dimension ld2 can be greater than 1.2 times the first maximum lateral dimension ld1. For example, the second maximum lateral dimension ld2 can be in a range from 1.3 times the first maximum lateral dimension ld1 and 6.0 times the first maximum lateral dimension ld1. In one embodiment, the second maximum lateral dimension ld2 of the second dummy pedestal channel portion 211 can be greater than 1.2 times, such as 1.3 to 6 times, the first maximum lateral dimension ld1 of the first dummy pedestal channel portion 111.

In one embodiment, each first-type support pillar structure 120 can have a third maximum lateral dimension ld3 along the second horizontal direction hd2 that is perpendicular to the first horizontal direction hd1. The third maximum lateral dimension ld3 can be in a range from 0.8 times the first maximum lateral dimension ld1 and 1.2 times the first maximum lateral dimension ld1. In one embodiment, the third maximum lateral dimension ld3 can be the same as the first maximum lateral dimension ld1. Thus, the second maximum lateral dimension ld2 can be greater than the third maximum lateral dimension ld3.

In one embodiment, each second-type support pillar structure 220 can have a fourth maximum lateral dimension ld4 along the second horizontal direction hd2 that is perpendicular to the first horizontal direction hd1. The second maximum lateral dimension ld2 can be greater than 1.2 times the fourth maximum lateral dimension ld4. For example, the second maximum lateral dimension ld2 can be in a range from 1.3 times the fourth maximum lateral dimension ld4 and 6.0 times the fourth maximum lateral dimension ld4. In one embodiment, the second maximum lateral dimension ld2 of the second dummy pedestal channel portion 211 can be greater than 1.2 times, such as 1.3 to 6 times, the fourth maximum lateral dimension ld4 of the second dummy pedestal channel portion 211. The fourth maximum lateral dimension ld4 can be the same as or greater than the first maximum lateral dimension ld1.

In one embodiment, the second dummy pedestal channel portions 211 of the second-type support pillar structures 220 can have a pair of vertical sidewalls that are parallel to the first horizontal direction hd1. In one embodiment, each first dummy pedestal channel portion 111 can have a circular horizontal cross-sectional shape, and each second dummy pedestal channel portion 211 can have a different, non-circular (e.g., oval, etc.) horizontal cross-sectional shape.

Each proximal sidewall 211P of the second dummy pedestal channel portions 211 can be laterally offset from the bottommost vertical step SB of the stepped surfaces of the alternating stack (32, 46) by a lateral offset distance "lod". The nominal value of the lateral offset distance "lod" between the bottommost vertical step SB of the alternating stack (32, 46) and the proximal sidewalls of the second dummy pedestal channel portions 211 can be greater than the maximum lithographic overlay tolerance along the first horizontal direction hd1 for the lithographic process employed to align the pattern of the second-type support openings 19' with respect to underlying overlay reference structures. For example, nominal value for the lateral offset distance "lod" can be in a range from 30 nm to 150 nm, and the maximum lithographic overlay tolerance can be in a range from 30% to 90% of the nominal value for the lateral offset distance "lod". In this case, the physical lateral offset distance "lod" as measured in manufactured devices can be positive for all sequences of processing steps within manufacturing specifications, and formation of a vertical semiconductor oxide plate 216 on each second dummy pedestal channel portion 211 occurs for all sequences of processing steps within manufacturing specification. By ensuring formation of the vertical semiconductor oxide plates 216 on proximal sidewalls 211P of the second dummy pedestal channel portion 211, the likelihood of electrical short between the bottommost electrically conductive layer 46 and the second-type support pillar structures 220 can be reduced or eliminated.

Figure 12E:
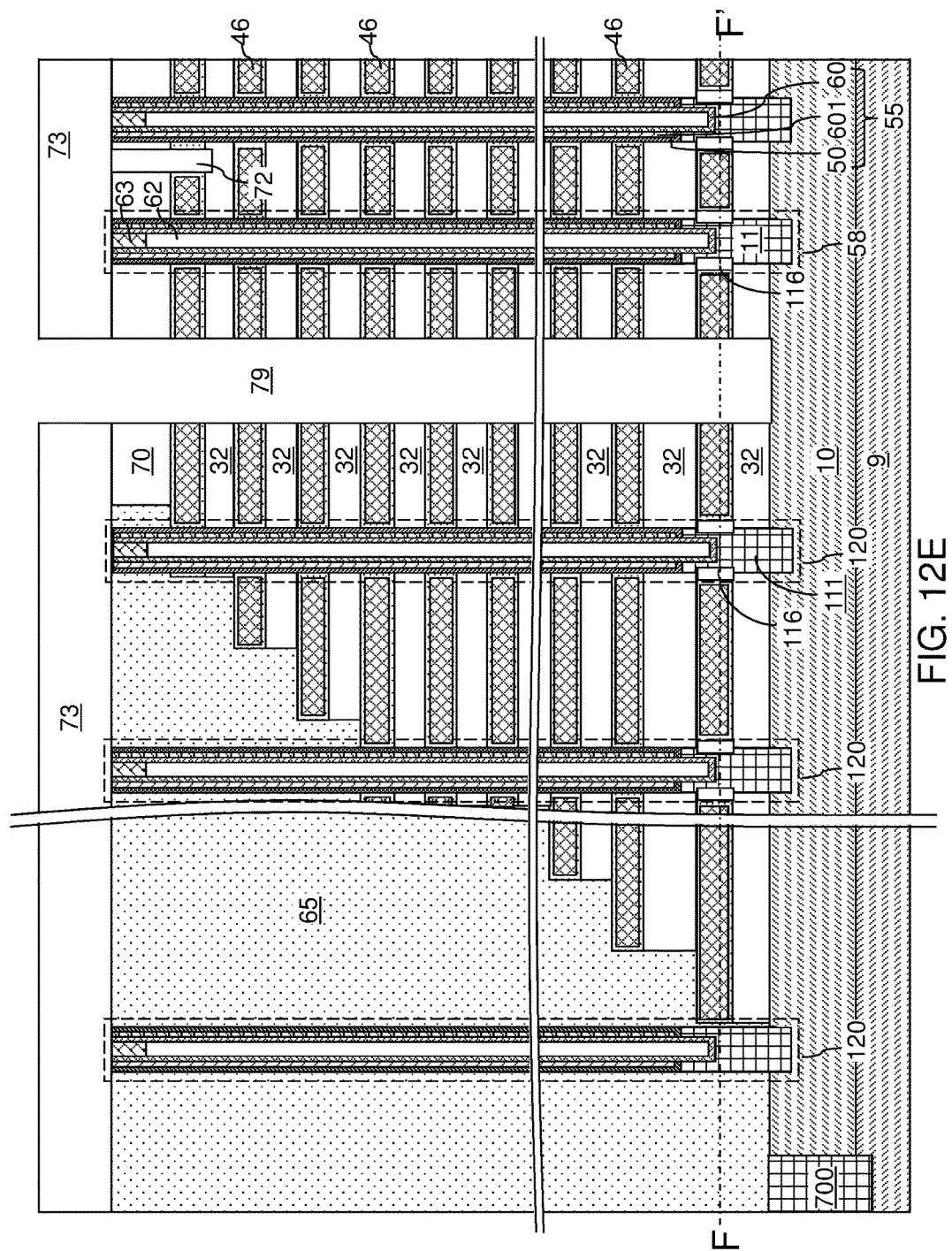
FIG. 12E is a schematic vertical cross-sectional view of the comparative exemplary structure after removal of a deposited conductive material from within the backside trenches.
Figure 12F:
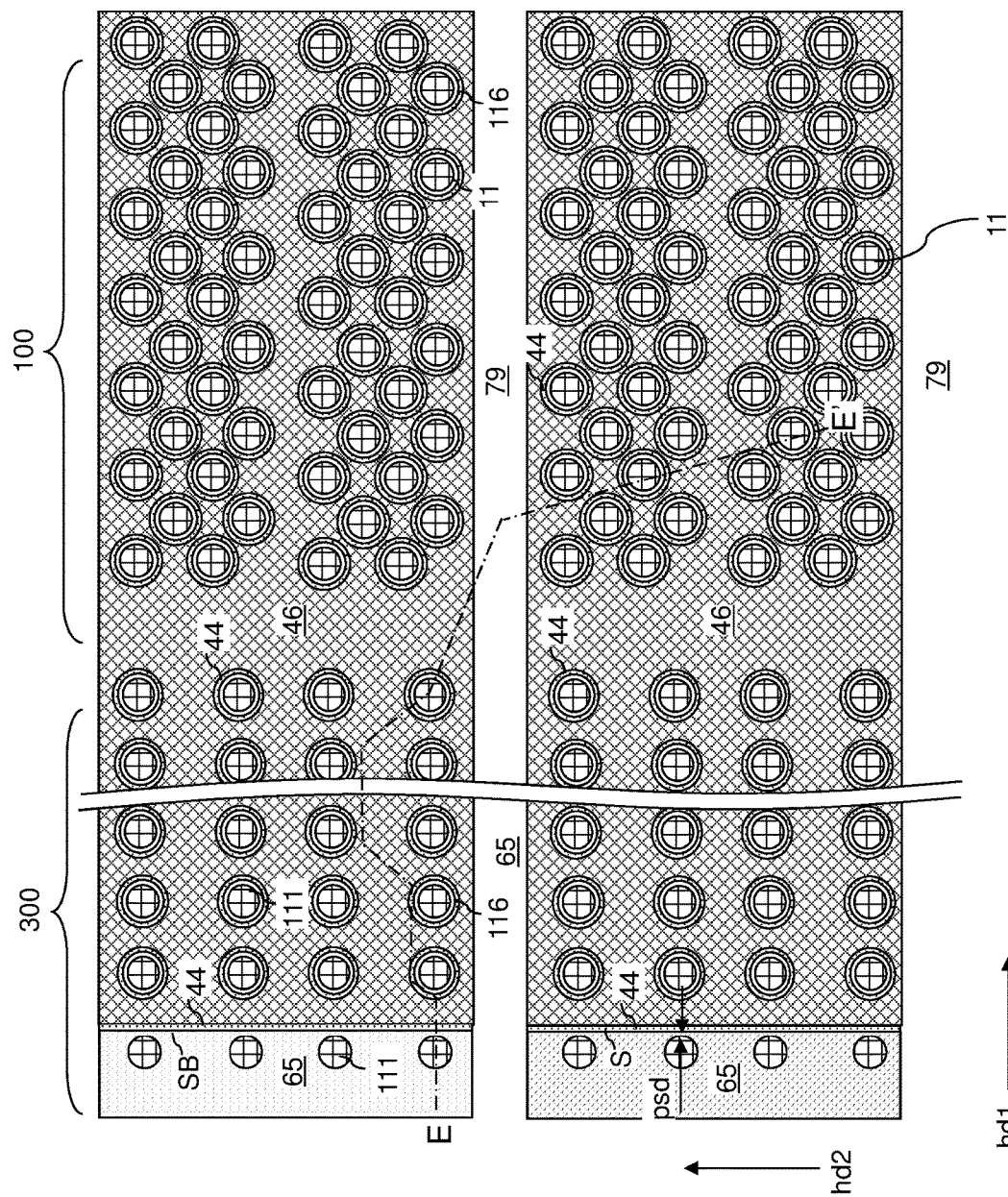
FIG. 12F is a horizontal cross-sectional view of the comparative exemplary structure along the horizontal plane E-E' of FIG. 12E. The vertical plane E-e' is the plane of the vertical cross-sectional view of FIG. 12E.

FIGS. 12E and 12F illustrate the comparative exemplary structure of FIGS. 9C and 9D after performing the processing steps of FIGS. 12A-12D thereupon. First-type support pillar structures 120 that are not physically exposed to the bottommost backside recess 43 at the processing steps of FIGS. 8C and 8D do not include any semiconductor oxide material portion on a respective first dummy pedestal channel portion 111. The first-type support pillar structures 120 that are more distal from the memory array region 100 than the bottommost vertical step SB of the stepped surfaces is from the memory array region 100 can have statistical variations in the physical separation distance "psd". One or more of the first-type support pillar structures 120 can have a physical separation distance "psd" that is prone to dielectric breakdown. For example, the physical separation distance "psd" can be less than 3 nm, and may be in a range from 0.5 nm to 2 nm, and a dielectric breakdown may occur between the bottommost electrically conductive layer 46 and the first dummy pedestal channel portions 111 during operation of a semiconductor device incorporating the comparative exemplary structure of FIGS. 12E and 12F.

Figure 13A:
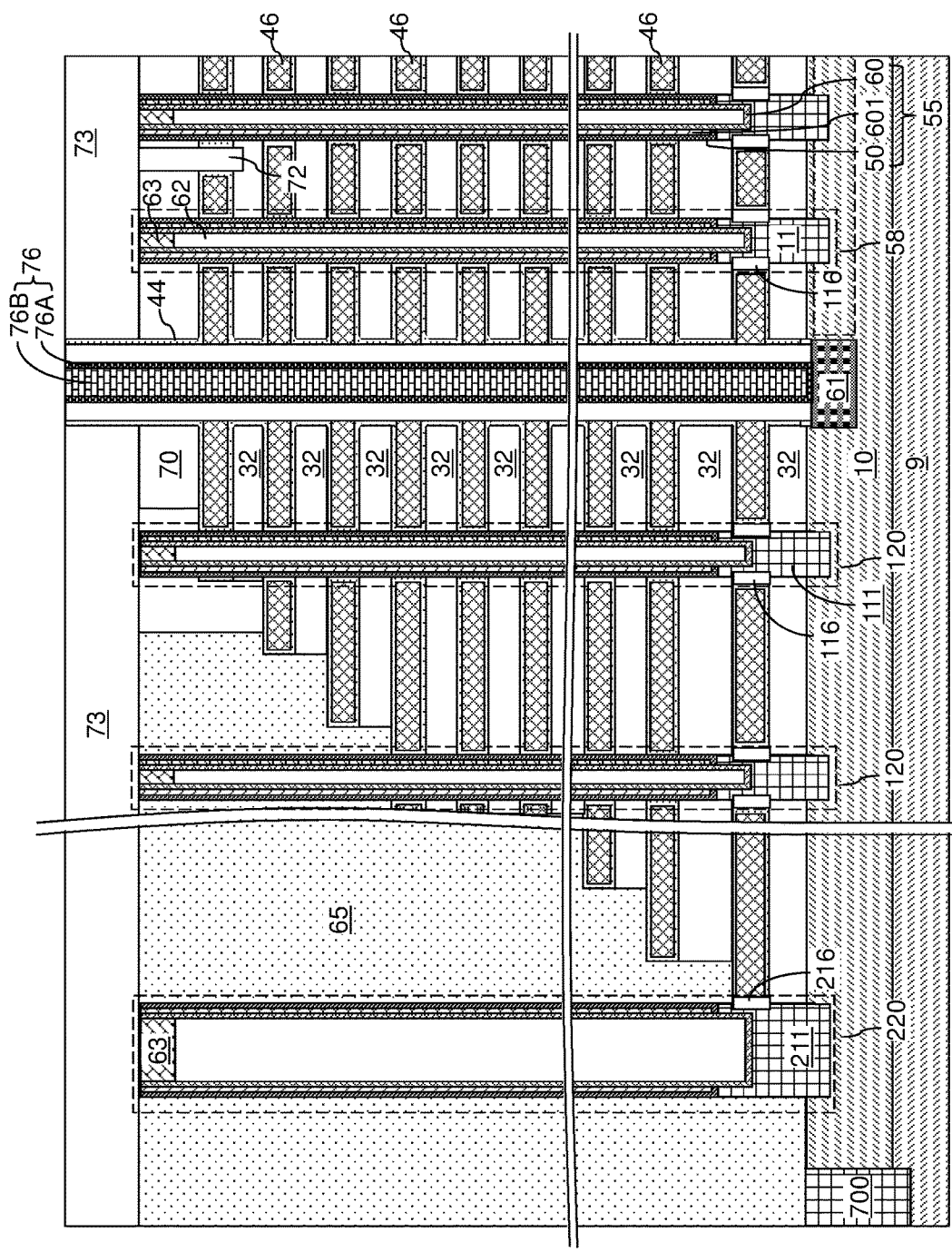
FIG. 13A is a schematic vertical cross-sectional view of the exemplary structure after formation of insulating spacers and backside contact via structures according to an embodiment of the present disclosure.
Figure 13B:
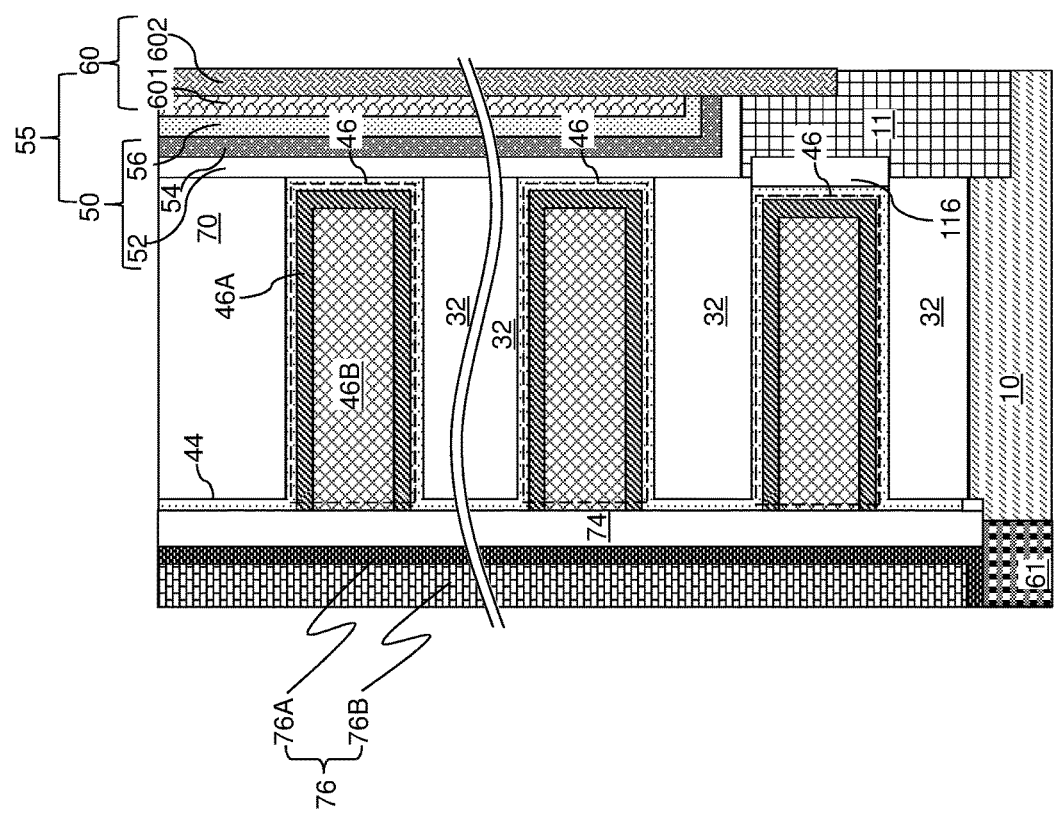
FIG. 13B is a top-down view of the exemplary structure of FIG. 13A. The vertical plane A-A' is the plane of the schematic vertical cross-sectional view of FIG. 13A.

Referring to FIGS. 13A and 13B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 14A:
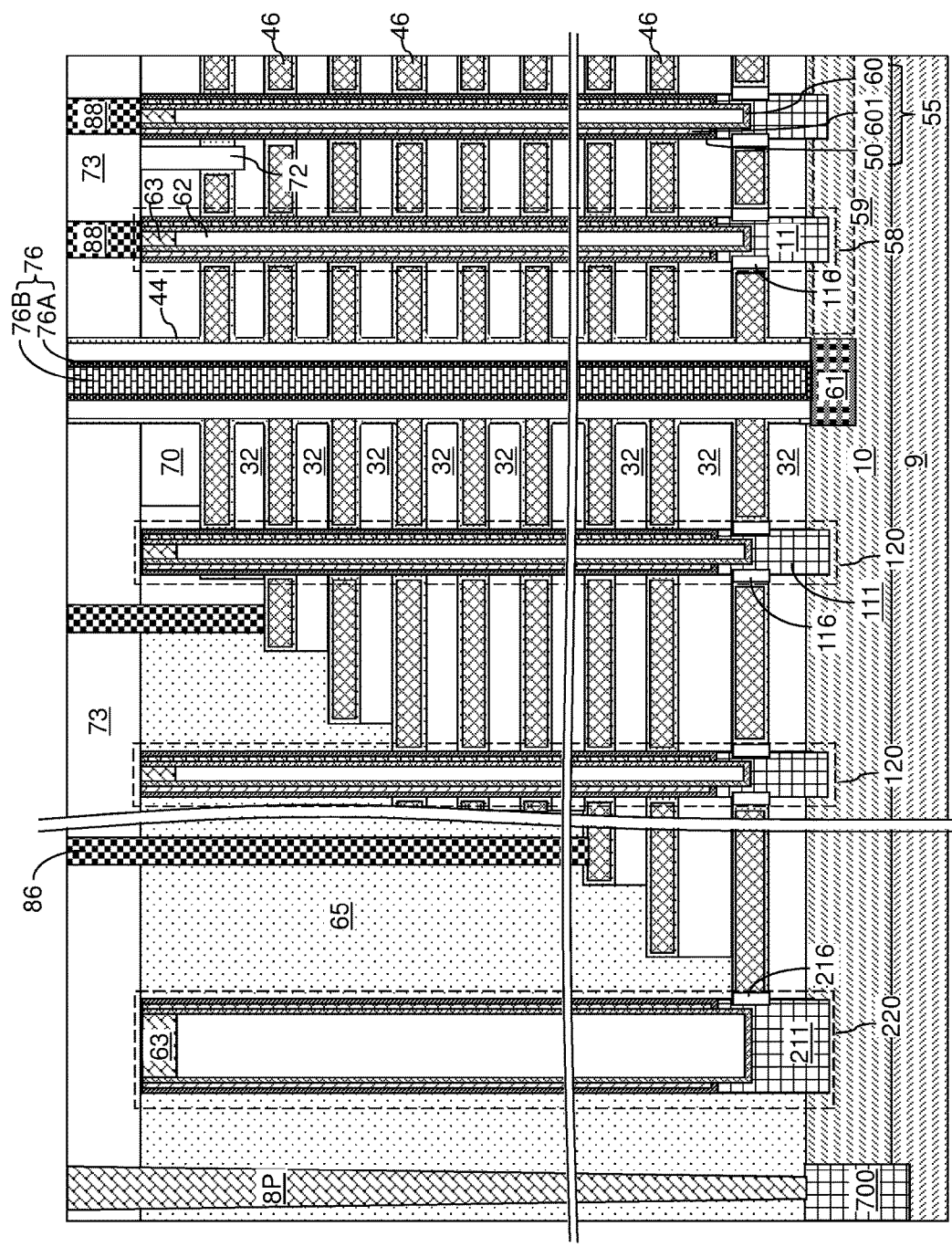
FIG. 14A is a schematic vertical cross-sectional view of the exemplary structure after formation of additional contact via structures according to an embodiment of the present disclosure.
Figure 14B:
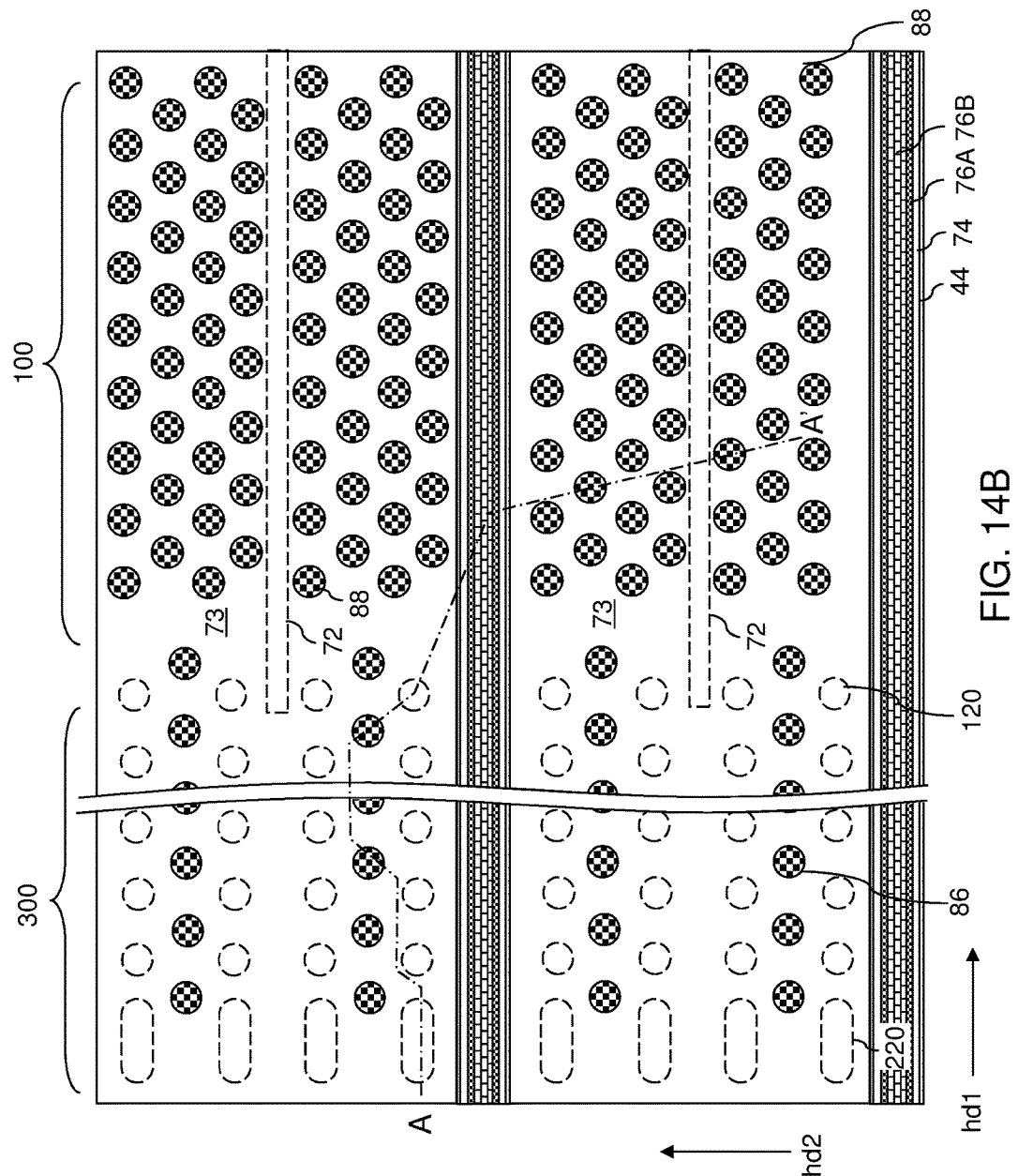
FIG. 14B is a top-down view of the exemplary structure of FIG. 14A. The vertical plane A-A' is the plane of the schematic vertical cross-sectional view of FIG. 14A.

Referring to FIGS. 14A and 14B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

In the exemplary structure of FIGS. 14A and 14B, the second dummy memory film 50 and the respective second dummy vertical semiconductor channel 60 in the second support pillar structures 220 have a larger diameter than the first dummy memory film 50 and the respective first dummy vertical semiconductor channel 60 in the first support pillar structures 120. A single second dummy memory film 50 and the single respective second dummy vertical semiconductor channel 60 are formed on each respective second dummy pedestal channel portion 211 in the second support pillar structures 220.

Referring to all drawings and according to various embodiments of the present disclosure, a three-dimensional memory device is provided, which comprises: an alternating stack of insulating layers 32 and electrically conductive layers 46 located over a substrate (9, 10), wherein the alternating stack includes stepped surfaces that continuously extend from a bottommost layer of the alternating stack to a topmost layer of the alternating stack with stepwise changes in height along a first horizontal direction hd1; memory stack structures 55 extending through each layer of the alternating stack (32, 46) in a memory array region 100, wherein each of the memory stack structures 55 comprises a respective memory film 50 and a respective vertical semiconductor channel 60 contacting an inner sidewall of the respective memory film 50, and wherein each of the memory stack structures 55 overlies a respective pedestal channel portion 11 which contacts a bottom surface of the memory film 50; and support pillar structures (120, 220) extending through the stepped surfaces of the alternating stack (32, 46). The support pillar structures (120, 220) comprise: first-type support pillar structures 120 vertically extending through at least two electrically conductive layers 46 within the alternating stack (32, 46) and comprising a respective first dummy memory film 50, and a respective first dummy vertical semiconductor channel 60, and a respective first dummy pedestal channel portion 111 having a respective first maximum lateral dimension ld1 along the first horizontal direction hd1; and second-type support pillar structures 220 vertically extending through no more than a single electrically conductive layer 46 within the alternating stack (32, 46) and comprising a respective second dummy memory film 50, and a respective second dummy vertical semiconductor channel 60, and a respective second dummy pedestal channel portion 211 having a respective second maximum lateral dimension ld2 along the first horizontal direction hd1 that is greater than the first maximum lateral dimension ld1.

In one embodiment, each of the first-type support pillar structures 120 comprises a tubular semiconductor oxide spacer 116 that is topologically homeomorphic to a torus and laterally surrounds a respective first dummy pedestal channel portion 111, and each of the second-type support pillar structures 220 comprises a vertical semiconductor oxide plate 216 that is topologically homeomorphic to a sphere and located on a respective second dummy pedestal channel portion 211. In one embodiment, each of the pedestal channel portions 11, the first dummy pedestal channel portions 111, and the second dummy pedestal channel portions 211 includes a same semiconductor material (e.g., silicon), each tubular semiconductor oxide spacer 116 and each vertical semiconductor oxide plate 216 comprise a dielectric semiconductor oxide of the same semiconductor material (e.g., silicon oxide). In one embodiment, each tubular semiconductor oxide spacer 116 and each vertical semiconductor oxide plate 216 have a same lateral thickness. In one embodiment, the three-dimensional memory device further comprises additional tubular semiconductor oxide spacers 116 laterally surrounding a respective one of the pedestal channel portions 11.

In one embodiment, the substrate (9, 10) comprises a semiconductor surface, which can be the top surface 7 of the substrate semiconductor layer 9 or the top surface of the optional semiconductor material layer 10 (if present). The three-dimensional memory device comprises a retro-stepped dielectric material portion 65 overlying the stepped surfaces of the alternating stack (32, 46). Each second dummy pedestal channel portion 211 includes a straight sidewall that continuously contacts the retro-stepped dielectric material portion 65 between the semiconductor surface and a top surface of the second dummy pedestal channel portion 211.

In one embodiment, each of the second-type support pillar structures 220 comprises a vertical semiconductor oxide plate 216 that is topologically homeomorphic to a sphere and including a respective pair of surfaces that contact the retro-stepped dielectric material portion 65. In one embodiment, each of the second dummy pedestal channel portions 211 contacts the retro-stepped dielectric material portion 65 (for example, along vertical planes that are parallel to the first horizontal direction hd1) and a respective vertical semiconductor oxide plate 216. In one embodiment, contact via structures 86 extending through the retro-stepped dielectric material portion 65 can contact a respective one of the electrically conductive layers 46.

In one embodiment, the ratio of the respective second maximum lateral dimension ld2 to a maximum lateral dimension along a second horizontal direction hd2 that is perpendicular to the first horizontal direction hd1 for each of the second-type support pillar structures 220 is within a range from 1.5 to 6.0. In other words, the length-to-width ratio of a horizontal cross-sectional shape of each second-type support pillar structure 220 can be in a range from 1.5 to 6.0. In one embodiment, a ratio of the respective second maximum lateral dimension hd2 of the respective second dummy pedestal channel portion 211 to the respective first maximum lateral dimension hd1 of the respective first dummy pedestal channel portion 111 is within a range from 1.3 to 6.0.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate, wherein the alternating stack includes stepped surfaces that continuously extend from a bottommost layer of the alternating stack to a topmost layer of the alternating stack with stepwise changes in height along a first horizontal direction;
   memory stack structures extending through each layer of the alternating stack in a memory array region, wherein each of the memory stack structures comprises a respective memory film and a respective vertical semiconductor channel contacting an inner sidewall of the respective memory film, and wherein each of the memory stack structures overlies a respective pedestal channel portion which contacts a bottom surface of the memory film; and
   support pillar structures extending through the stepped surfaces of the alternating stack, wherein the support pillar structures comprise:
   first-type support pillar structures vertically extending through at least two electrically conductive layers within the alternating stack and comprising a respective first dummy memory film, and a respective first dummy vertical semiconductor channel, and a respective first dummy pedestal channel portion having a respective first maximum lateral dimension along the first horizontal direction; and
   second-type support pillar structures vertically extending through no more than a single electrically conductive layer within the alternating stack and comprising a respective second dummy memory film, and a respective second dummy vertical semiconductor channel, and a respective second dummy pedestal channel portion having a respective second maximum lateral dimension along the first horizontal direction that is greater than the first maximum lateral dimension.

2. The three-dimensional memory device of claim 1, wherein:
   each of the first-type support pillar structures comprises a tubular semiconductor oxide spacer that is topologically homeomorphic to a torus and that laterally surrounds a respective first dummy pedestal channel portion; and
   each of the second-type support pillar structures comprises a vertical semiconductor oxide plate that is topologically homeomorphic to a sphere and that is located on a sidewall of a respective second dummy pedestal channel portion.

3. The three-dimensional memory device of claim 2, wherein:
- each of the pedestal channel portions, the first dummy pedestal channel portions, and the second dummy pedestal channel portions comprise silicon; and
- each tubular semiconductor oxide spacer and each vertical semiconductor oxide plate comprise silicon oxide.

4. The three-dimensional memory device of claim 3, wherein each tubular semiconductor oxide spacer and each vertical semiconductor oxide plate have a same lateral thickness.

5. The three-dimensional memory device of claim 2, further comprising additional tubular semiconductor oxide spacers laterally surrounding a respective one of the pedestal channel portions.

6. The three-dimensional memory device of claim 1, wherein the substrate comprises a semiconductor surface, and further comprising a retro-stepped dielectric material portion overlying the stepped surfaces of the alternating stack, wherein each second dummy pedestal channel portion includes a straight sidewall that continuously contacts the retro-stepped dielectric material portion between the semiconductor surface and a top surface of the second dummy pedestal channel portion.

7. The three-dimensional memory device of claim 6, wherein:
- each of the second-type support pillar structures comprises a vertical semiconductor oxide plate that is topologically homeomorphic to a sphere and including a respective pair of surfaces that contact the retro-stepped dielectric material portion; and
- each of the second dummy pedestal channel portions contacts the retro-stepped dielectric material portion and a respective vertical semiconductor oxide plate.

8. The three-dimensional memory device of claim 6, further comprising contact via structures extending through the retro-stepped dielectric material portion and contacting a respective one of the electrically conductive layers.

9. The three-dimensional memory device of claim 1, wherein:
- a ratio of the respective second maximum lateral dimension to a maximum lateral dimension along a second horizontal direction that is perpendicular to the first horizontal direction for each of the second-type support pillar structures is within a range from 1.5 to 6.0; and
- a ratio of the respective second maximum lateral dimension of the respective second dummy pedestal channel portion to the respective first maximum lateral dimension of the respective first dummy pedestal channel portion is within a range from 1.3 to 6.0.

10. The three-dimensional memory device of claim 1, wherein:
- the three-dimensional memory device comprises a monolithic three-dimensional NAND memory device;
- the electrically conductive layers comprise, or are electrically connected to, a respective word line of the monolithic three-dimensional NAND memory device;
- the substrate comprises a silicon substrate;
- the monolithic three-dimensional NAND memory device comprises an array of monolithic three-dimensional NAND strings over the silicon substrate;
- at least one memory cell in a first device level of the array of monolithic three-dimensional NAND strings is located over another memory cell in a second device level of the array of monolithic three-dimensional NAND strings;
- the silicon substrate contains an integrated circuit comprising a driver circuit for the memory device located thereon;
- the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
- the array of monolithic three-dimensional NAND strings comprises:
- a plurality of semiconductor channels, wherein at least one end portion of each of the plurality of semiconductor channels extends substantially perpendicular to a top surface of the substrate, and
- a plurality of charge storage elements, each charge storage element located adjacent to a respective one of the plurality of semiconductor channels.

11. A method of forming a three-dimensional memory device, comprising:
- forming an alternating stack of insulating layers and sacrificial material layers over a substrate having a semiconductor surface;
- forming stepped surfaces that continuously extend from a bottommost layer of the alternating stack to a topmost layer of the alternating stack with stepwise changes in height along a first horizontal direction by patterning the alternating stack;
- forming memory openings, first-type support openings, and second-type support openings through the alternating stack, wherein one or more of the second-type support openings cut through a bottommost vertical step of the stepped surfaces, each of the first-type support openings extends through a plurality of insulating layers within the alternating stack, and each of the memory openings vertically extends through each layer within the alternating stack, and wherein the second-type support openings have a respective maximum lateral dimension along the first horizontal direction that is greater than maximum lateral dimensions of the first-type support openings along the first horizontal direction;
- forming memory stack structures, first-type support pillar structure, and second-type support pillar structures through the alternating stack in the memory opening, the first-type support openings, and the second-type support openings, respectively; and
- replacing the spacer material layers with electrically conductive layers.

12. The method of claim 11, wherein:
- each of the memory stack structures comprises a respective memory film and a respective vertical semiconductor channel contacting an inner sidewall of the respective memory film, and overlies a respective pedestal channel portion contacting a bottom surface of the memory film;
- the first-type support pillar structures vertically extend through at least two electrically conductive layers within the alternating stack and comprise a respective first dummy memory film, and a respective first dummy vertical semiconductor channel, and a respective first dummy pedestal channel portion having a respective first maximum lateral dimension along the first horizontal direction; and
- the second-type support pillar structures vertically extend through no more than a single electrically conductive layer within the alternating stack and comprise a respective second dummy memory film, and a respective second dummy vertical semiconductor channel, and a respective second dummy pedestal channel portion having a respective second maximum lateral dimension along the first horizontal direction that is greater than the first maximum lateral dimension.

13. The method of claim 12, further comprising:
forming a tubular semiconductor oxide spacer that is topologically homeomorphic to a torus around each first dummy pedestal channel portion by oxidizing a surface portion of each first dummy pedestal channel portion; and
forming a vertical semiconductor oxide plate that is topologically homeomorphic to a sphere on each second dummy pedestal channel portion by oxidizing a surface portion of each second dummy pedestal channel portion.

14. The method of claim 13, wherein:
the pedestal channel portions, the first dummy pedestal channel portions, and the second dummy pedestal channel portions are formed by selectively growing a semiconductor material on physically exposed parts of the semiconductor surface at bottom regions of the memory stack structures, the first-type support pillar structures, and the second-type support pillar structures while suppressing growth of the semiconductor material from dielectric surfaces; and
the tubular semiconductor oxide spacers and the vertical semiconductor oxide plates are formed by oxidation of surface portions of the first dummy pedestal channel portions, and the second dummy pedestal channel portions.

15. The method of claim 11, further comprising forming a retro-stepped dielectric material portion over the stepped surfaces of the alternating stack, wherein each second dummy pedestal channel portion includes a straight sidewall that continuously contacts the retro-stepped dielectric material portion between a top surface of the semiconductor material layer and a top surface of the second dummy pedestal channel portion.

16. The method of claim 15, further comprising forming contact via structures through the retro-stepped dielectric material portion on a respective one of the electrically conductive layers.

17. The method of claim 11, wherein:
one or more of the second-type support openings cut through only a single sacrificial material layer among the alternating stack; and
the method further comprises selectively growing a semiconductor material on physically exposed parts of the semiconductor surface at bottom regions of the memory openings, the first-type support openings, and the second-type support openings, while suppressing growth of the semiconductor material from dielectric surfaces to form the pedestal channel portions, the first dummy pedestal channel portions, and the second dummy pedestal channel portions in the memory openings, the first-type support openings, and the second-type support openings, respectively.

18. The method of claim 17, further comprising:
forming backside trenches through the alternating stack after formation of the memory stack structures; and
forming backside recesses by removing the sacrificial material layers selective to the insulating layers, wherein sidewalls of the pedestal channel portions, the first dummy pedestal channel portions, and the second dummy pedestal channel portions are exposed in the backside recesses.

19. The method of claim 18, further comprising oxidizing the exposed surface portions of the pedestal channel portions, the first dummy pedestal channel portions, and the second dummy pedestal channel portions, wherein a tubular semiconductor oxide spacer that is topologically homeomorphic to a torus is formed around each first dummy pedestal channel portion and a vertical semiconductor oxide plate that is topologically homeomorphic to a sphere is formed on each second dummy pedestal channel portion.

20. The method of claim 17, wherein:
each of the pedestal channel portions and the first dummy pedestal channel portions is spaced from the retro-stepped dielectric material portion; and
each of the second dummy pedestal channel portions contacts the retro-stepped dielectric material portion.

* * * * *